(12) United States Patent
Liang et al.

(10) Patent No.: US 7,120,655 B2
(45) Date of Patent: Oct. 10, 2006

(54) DIGITAL FILTER

(75) Inventors: Jui Liang, Laguna Niguel, CA (US); Gonghai Ren, Sunnyvale, CA (US)

(73) Assignee: Integrated Device Technology, Inc., San Jose, CA (US)

( * ) Notice: Subject to any disclaimer, the term of this patent is extended or adjusted under 35 U.S.C. 154(b) by 572 days.

(21) Appl. No.: 10/351,591

(22) Filed: Jan. 27, 2003

(65) Prior Publication Data

US 2003/0200241 A1    Oct. 23, 2003

Related U.S. Application Data

(60) Provisional application No. 60/351,997, filed on Jan. 25, 2002.

(51) Int. Cl.
    *G06F 17/10*    (2006.01)
(52) U.S. Cl. .................................................. 708/300
(58) Field of Classification Search ............... 708/300, 708/304, 309
    See application file for complete search history.

(56) References Cited

U.S. PATENT DOCUMENTS 5,432,514 A    7/1995    Mukuda et al.
6,081,820 A    6/2000    Holowko

FOREIGN PATENT DOCUMENTS

GB    1 266 038    3/1972

OTHER PUBLICATIONS

Stuart S. Perlman et al., "Adaptive Median Filtering for Impulse Noise Elimination in Real-Time TV Signals," IEEE Transactions on Communications, vol. COM-3, No. 6, pp. 646-652, Jun. 1987.
Hyun Man Chang et al., "Implementation of a DSSS Modem ASIC Chip for Wireless LAN," Signal Processing Systems (SIPS) 1998. 1998 IEEE Workshop on Cambridge, MA Oct. 8-10, 1998, IEEE, New York, NY. pp. 243-252.
PCT Search Report, mailed Jul. 15, 2003 in corresponding PCT/US 03/02200.

*Primary Examiner*—D. H. Malzahn
(74) *Attorney, Agent, or Firm*—Akin Gump Strauss Hauer & Feld, LLP

(57) ABSTRACT

Methods and apparatus of signal processing are described. In a method according to one embodiment, a high-frequency region of a digital signal is detected. In response to the detecting, the high-frequency content of the digitized signal is increased in at least a portion of that region.

9 Claims, 31 Drawing Sheets

DIGITAL FILTER

RELATED APPLICATIONS

This application claims priority to U.S. Provisional Patent application No. 60/351,997, filed Jan. 25, 2002 and entitled "DIGITAL FILTER FOR ADC".

BACKGROUND

1. Field of the Invention

This invention relates to signal processing.

2. Background Information

Signals carrying perceptual information, such as video and audio signals, are commonly transferred in analog form. Such analog transfer may occur even in cases where the perceptual information was created digitally or obtained from a digital source. For example, personal computers and other video generation devices (e.g. digital versatile disk (DVD) players) typically output analog video signals for display on cathode-ray-tube (CRT) monitors or other devices including CRTs such as television sets.

Unfortunately, the analog signal may become degraded during transfer. For example, environmental electromagnetic interference may produce noise in the signal. Other environmental factors such as temperature may affect timing or other characteristics of circuitry used to process the signal. High frequencies of the signal may also be attenuated by the signal path. Depending upon the particular cause, such degradations may occur in high-frequency and/or in low-frequency regions of the signal, and upon display of the signal they may be manifested by effects such as nonuniformities, random specks, or reductions in resolution or sharpness.

Noise problems may also become worse as the number of pixels in a display grows. For example, a large image display has more pixels than a small one. A phase-locked loop (PLL) may be used to control a clock of an analog-to-digital converter for digitizing the signal for display on a digital display (e.g. a liquid-crystal display). As the number of pixels increases, the PLL must run at a higher speed, which may give rise to increased jitter. Such increased jitter may be visible in the displayed signal as noise.

Noise may also cause the appearance of undesirable artifacts in low-frequency regions of a video signal. Such effects may be visible as variation, as the eye is more sensitive to noise in these regions. Noise of this type may be due to amplitude and/or phase variations in analog signal.

Moreover, the quality of an RGB-out signal may vary greatly. For example, it may be desired to display a signal from a video source whose output signal deviates from the VESA standard.

Automatic gain control may be used to control some noise problems, but at some point such techniques may also adversely affect signal contrast and brightness.

SUMMARY

A digital filter according to one embodiment of the invention includes a local frequency state detector (LFSD). The LFSD is configured to indicate a predetermined local frequency state in a sequence of data values. The filter also includes a regional frequency state detector (RFSD), which is configured to detect a predetermined condition in a region of the sequence, based on a plurality of local frequency state indications. The RFSD is also configured to output a select signal based on the detection. A compensator is configured to output a compensated value of a value of the sequence, and a selector is configured to output one of the value and the compensated value, based on the select signal.

DETAILED DESCRIPTION

Figure 1:
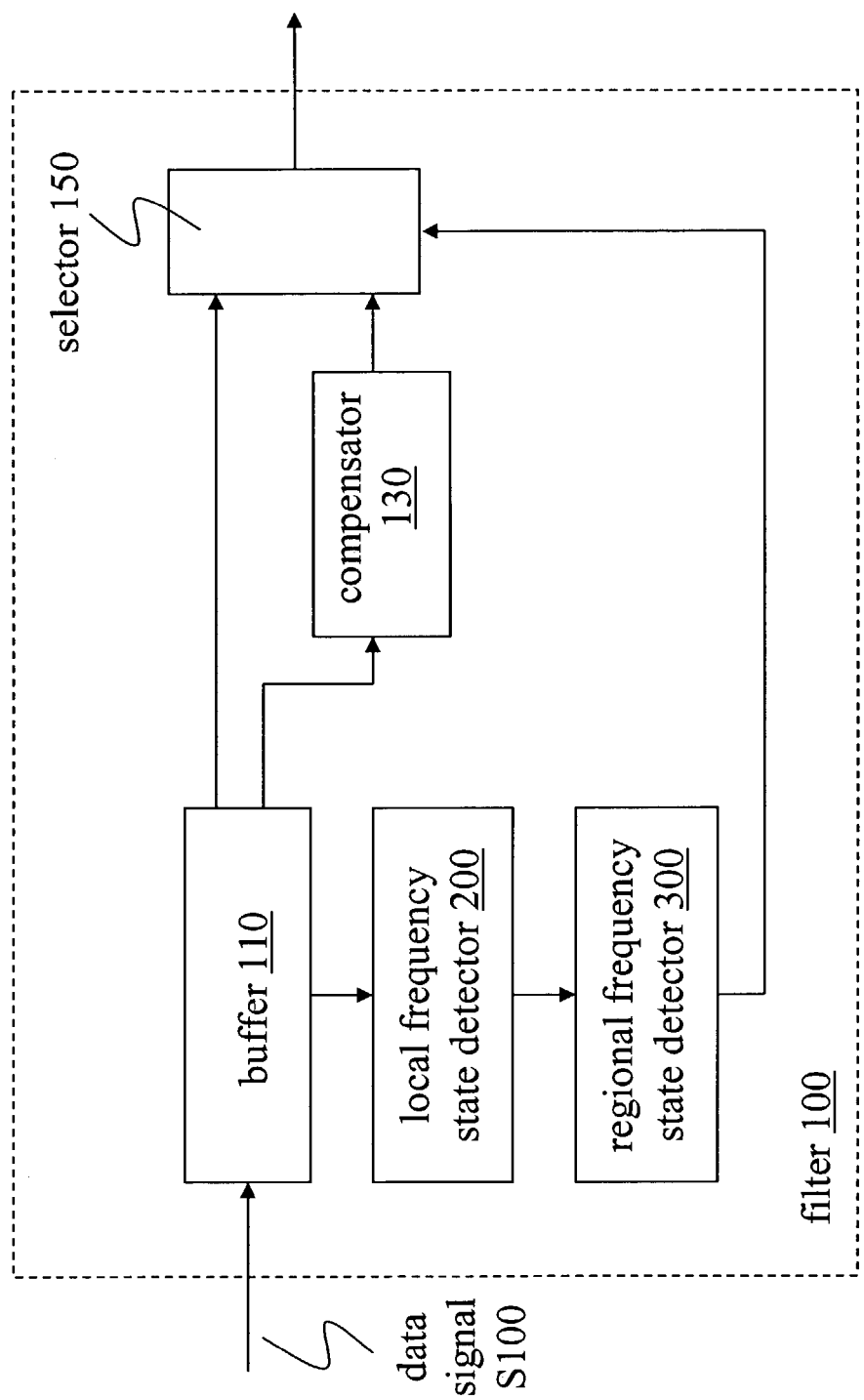
FIG. 1 shows a block diagram of a filter 100 according to an embodiment of the invention.

FIG. 1 shows a block diagram of a digital filter 100 according to an embodiment of the invention. Buffer 110 receives a data signal S100 and stores a sequence of digital values of the signal. Local frequency state detector (LFSD) 200 indicates the detection of a particular frequency state at a location of the sequence. Based on two or more such indications, regional frequency state detector (RFSD) 300 detects the presence of a particular frequency state in a region of the sequence and outputs a select signal based on the detection. Compensator 130 produces one or more compensated values based on one or more values of the sequence. Based on the select signal outputted by RFSD 300, selector 150 passes a value of the sequence or a compensated value.

Figure 2:
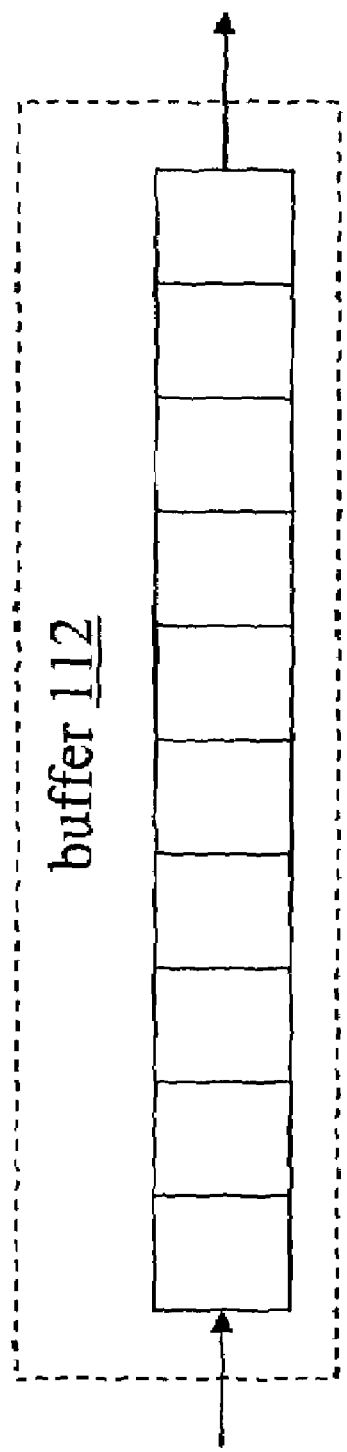
FIG. 2 shows a block diagram of an implementation 112 of buffer 110.

Buffer 110 may be implemented as a FIFO (first-in-first-out) buffer. FIG. 2 shows one such example of an implementation 112 of buffer 110 as a 10-value shift register. In this example, digital values of signal S100 are shifted into, through, and out of buffer 112 according to a clock signal (not shown).

For an application in which values shifted into buffer 110 have more than one bit, such a buffer may be constructed as a parallel arrangement of 10-bit shift registers. Alternatively, buffer 110 may be implemented in software or firmware as a sequence of instructions.

In an exemplary application, data signal S100 is received as a string of bytes outputted by an analog-to-digital converter (ADC). In a particular such application, buffer 110 stores parallel sets of eight consecutive samples, each sample being of size one byte (i.e. eight bits). For example, buffer 110 may store triples of signal values that represent pixels in an RGB color space. Alternatively, buffer 110 may be used to store n-tuples of values representing pixels in another color space. In another implementation, buffer 110 may receive and store signal values representing two or more audio channels.

For an application in which buffer 110 stores values in parallel, it may be desirable to use different numbers of bits to store each of the various values. For example, more bits may be used to store a value representing luminance information than are used to store a value representing chrominance information (e.g. for values representing pixels in a YUV or YCrCb color space). It may also be desirable for signal S100 to contain (and for filter 100 to process) related strings of values at different resolutions (e.g. more luminance values than chrominance values for the same area of picture space).

Figure 3:
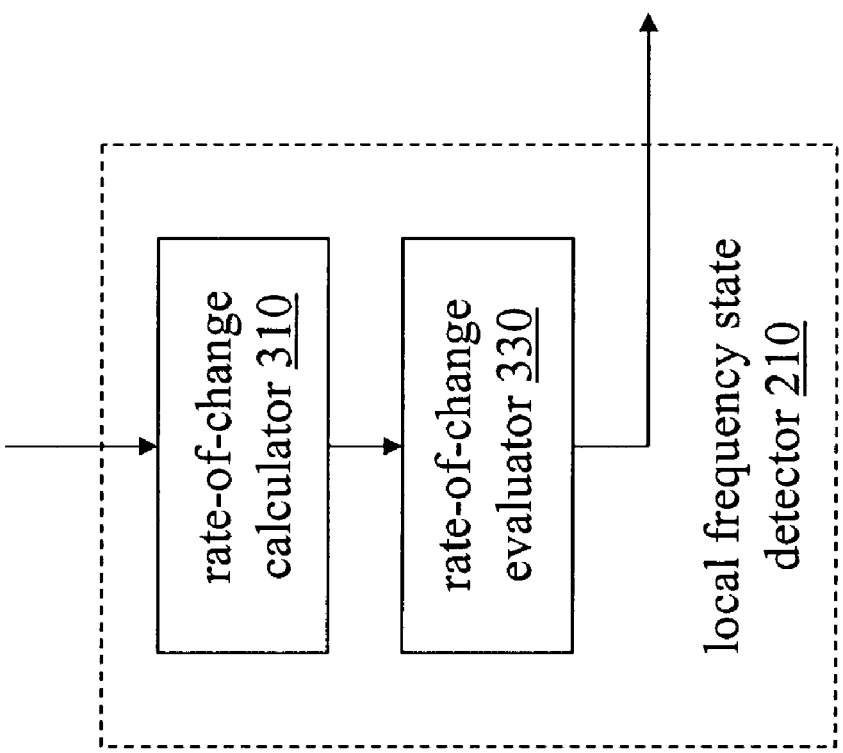
FIG. 3 shows a block diagram of an implementation 210 of local frequency state detector 200.

Local frequency state detector 200 receives two or more values of the sequence and indicates whether a predetermined condition exists with respect to those values. FIG. 3 shows an implementation 210 of local frequency state detector 200 that includes a rate-of-change (ROC) calculator 310 and a ROC evaluator 330.

Figure 4:
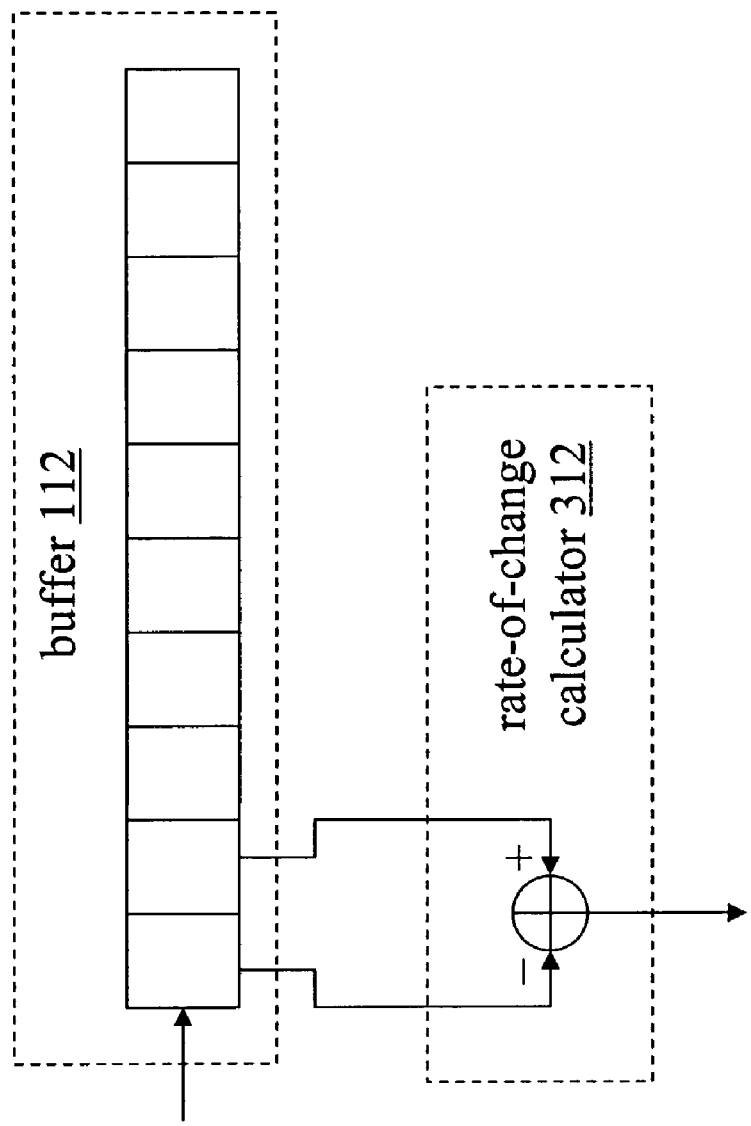
FIG. 4 shows a block diagram of an implementation 312 of rate-of-change (ROC) calculator 310 and also shows an application of ROC calculator 312.

ROC calculator 310 calculates a rate of change among values of the sequence. FIG. 4 shows an implementation 312 of ROC calculator 310 which calculates a ROC as a difference between two values. FIG. 4 also shows application of ROC calculator 312 to calculate a ROC as a difference between the two values most recently stored to buffer 112.

Figure 5:
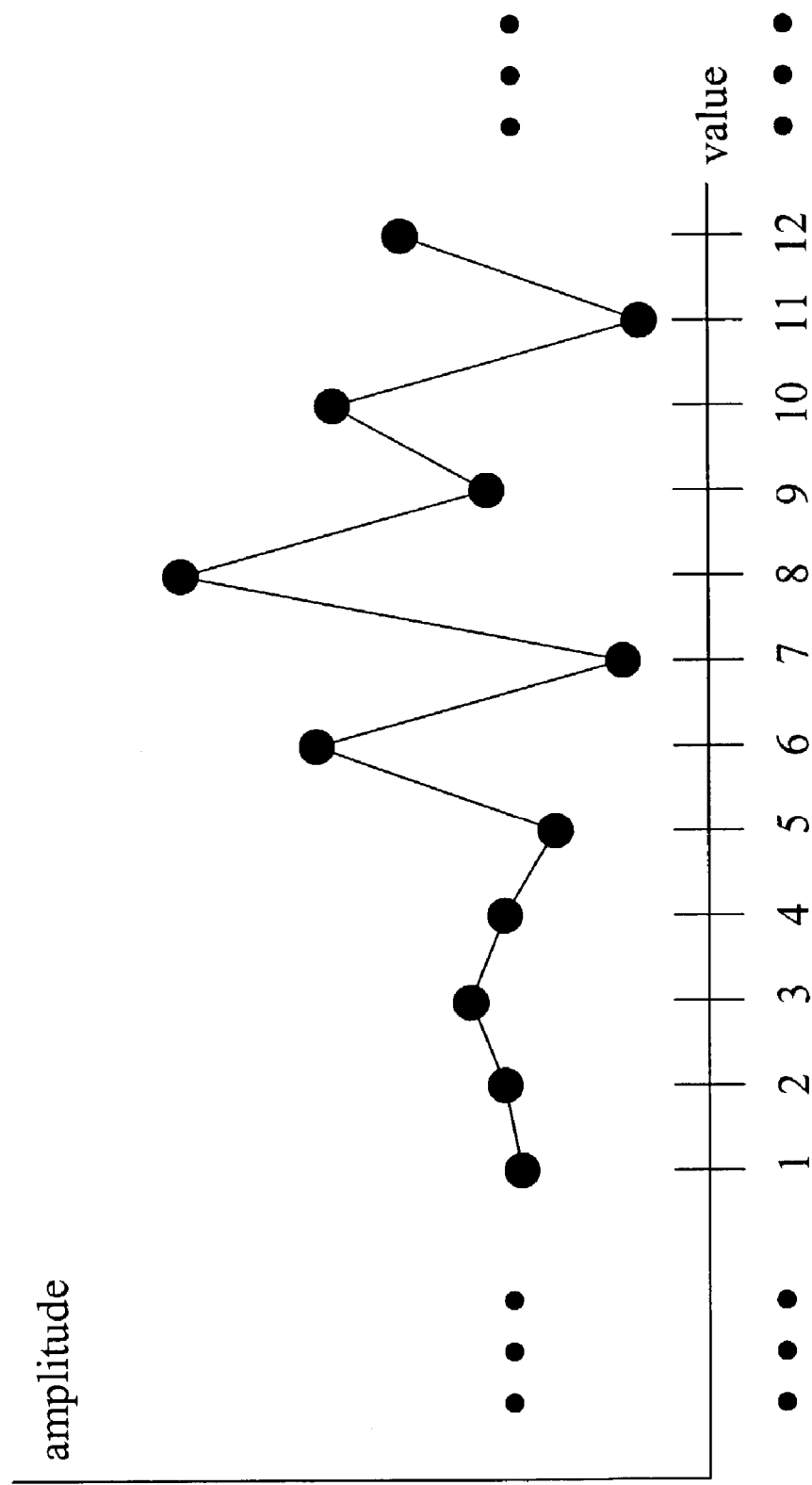
FIG. 5 shows an example of a portion of a digital signal S100.

FIG. 5 shows a portion of an example sequence from data signal S100. In this example, the values are shifted into buffer 112 from left to right, the points represent the amplitudes for each value, and the lines connecting the points serve only to better illustrate the behavior of the signal. One may observe that up to value 5, the frequency content of the sequence is relatively low, and that at value 6, the frequency content of the sequence is increased.

Figure 6:
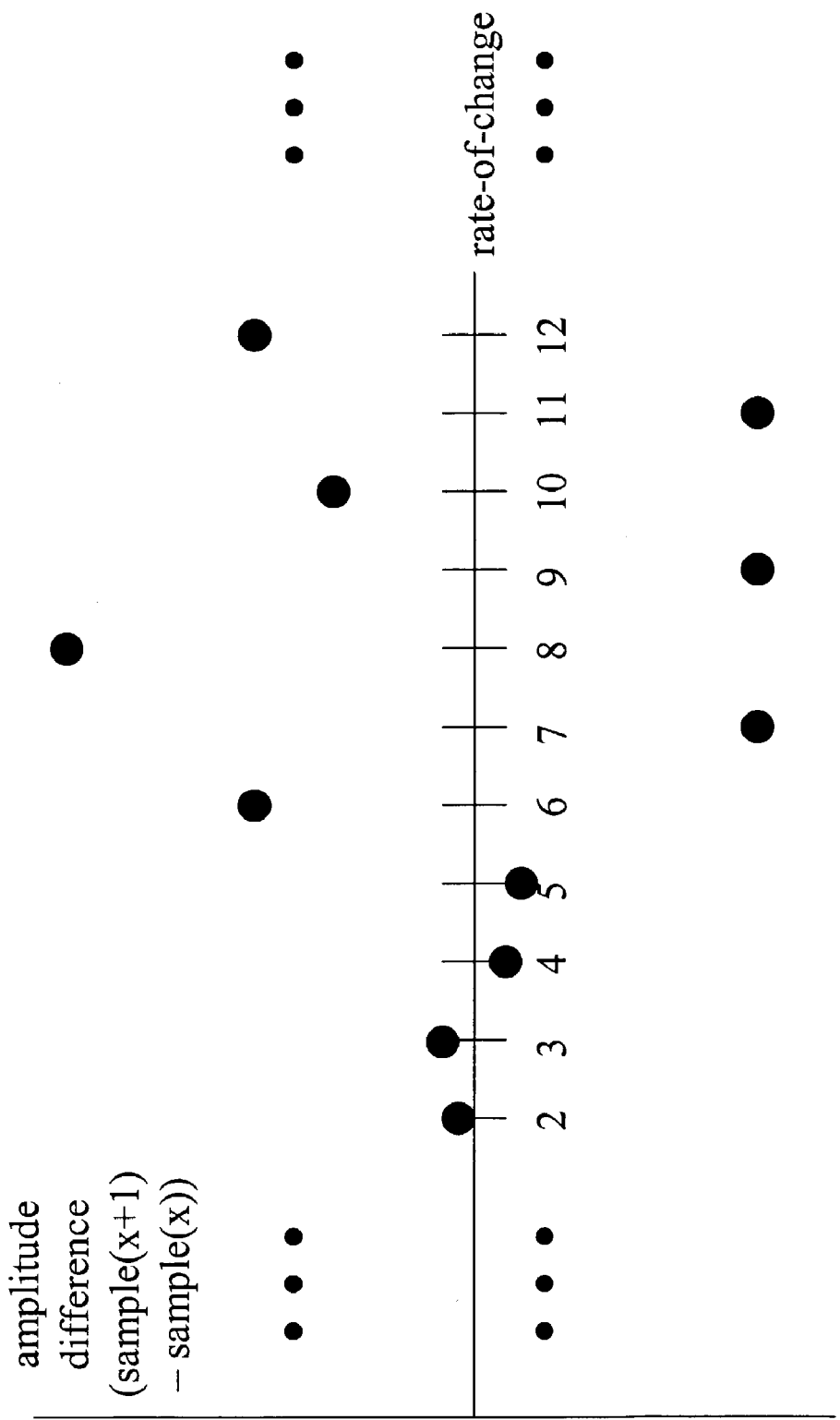
FIG. 6 shows a series of rates-of-change calculated from the signal portion of FIG. 5.

FIG. 6 shows an example of a sequence of ROCs outputted by ROC calculator 312 as applied in FIG. 4 in response to the signal portion shown in FIG. 5. In this illustration, ROC 2 corresponds to value 2 and indicates a difference between values 1 and 2, ROC 3 corresponds to value 3 and indicates a difference between values 2 and 3, and so on.

Figure 7:
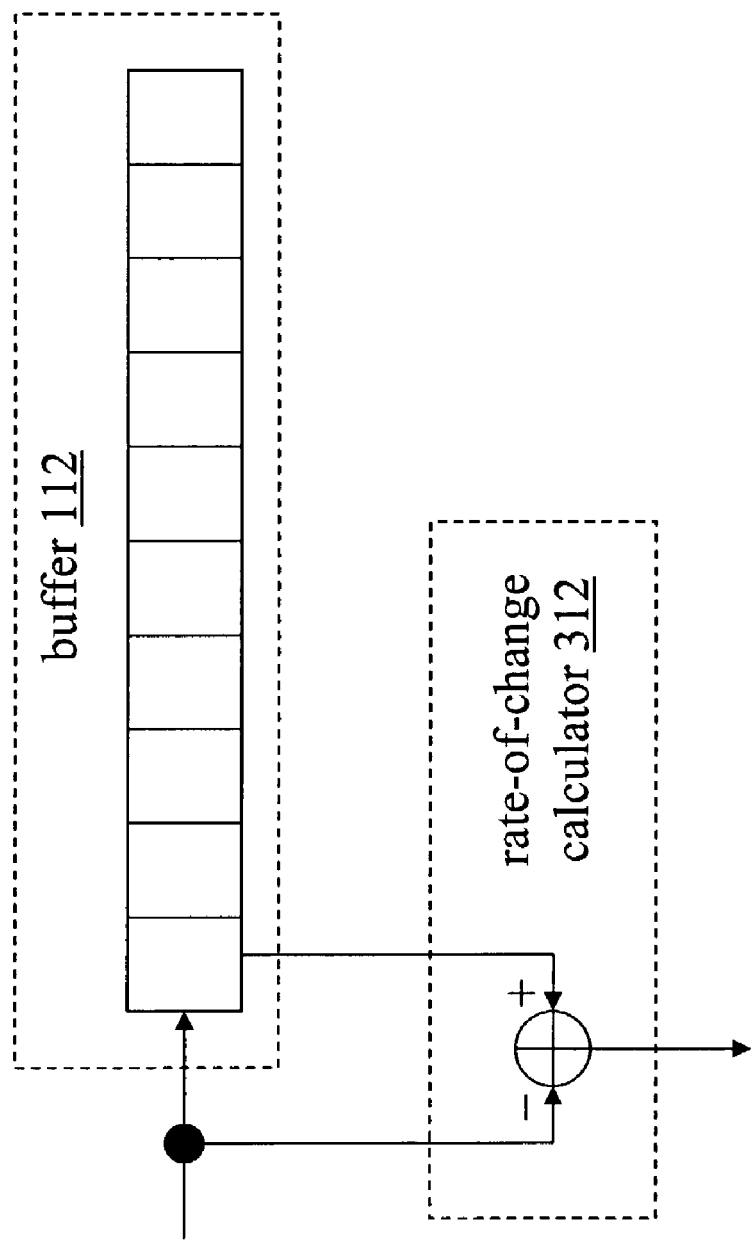
FIG. 7 shows an alternate application of ROC calculator 312.

FIG. 7 shows an alternate application of ROC calculator 312 to calculate a ROC as a difference between the value most recently stored to buffer 112 and the next value of signal S100. ROC calculator 312 may also be applied to calculate a difference in the other direction (i.e. to subtract the right-hand value from the left-hand value). Other implementations of ROC calculator 310 may calculate a ROC from two or more values of signal S100 by applying a different function (e.g. one having a finite or infinite impulse response).

Figure 8:
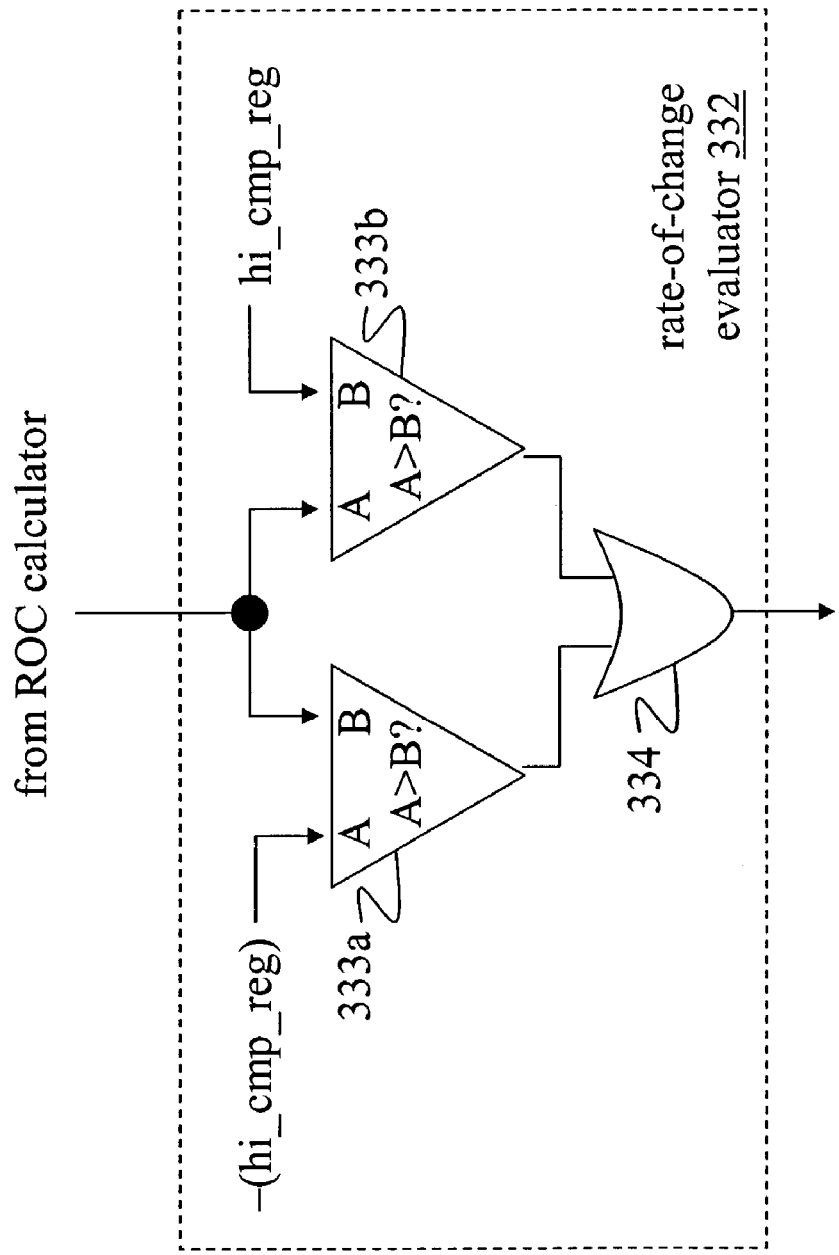
FIG. 8 shows a block diagram of an implementation 332 of ROC evaluator 330.

ROC evaluator 330 evaluates the ROCs calculated by ROC calculator 310 according to one or more predetermined criteria. FIG. 8 shows an implementation 332 of ROC evaluator 330 which compares the magnitude of a ROC with that of a predetermined ROC threshold hi_cmp_reg. This particular implementation uses comparators 333a, 333b to compare the ROC with predetermined upper and lower bounds (e.g. to evaluate the expressions (ROC>hi_cmp_reg) and (ROC<-(hi_cmp_reg)) and an OR gate 334 to indicate the overall evaluation result.

Figure 9:
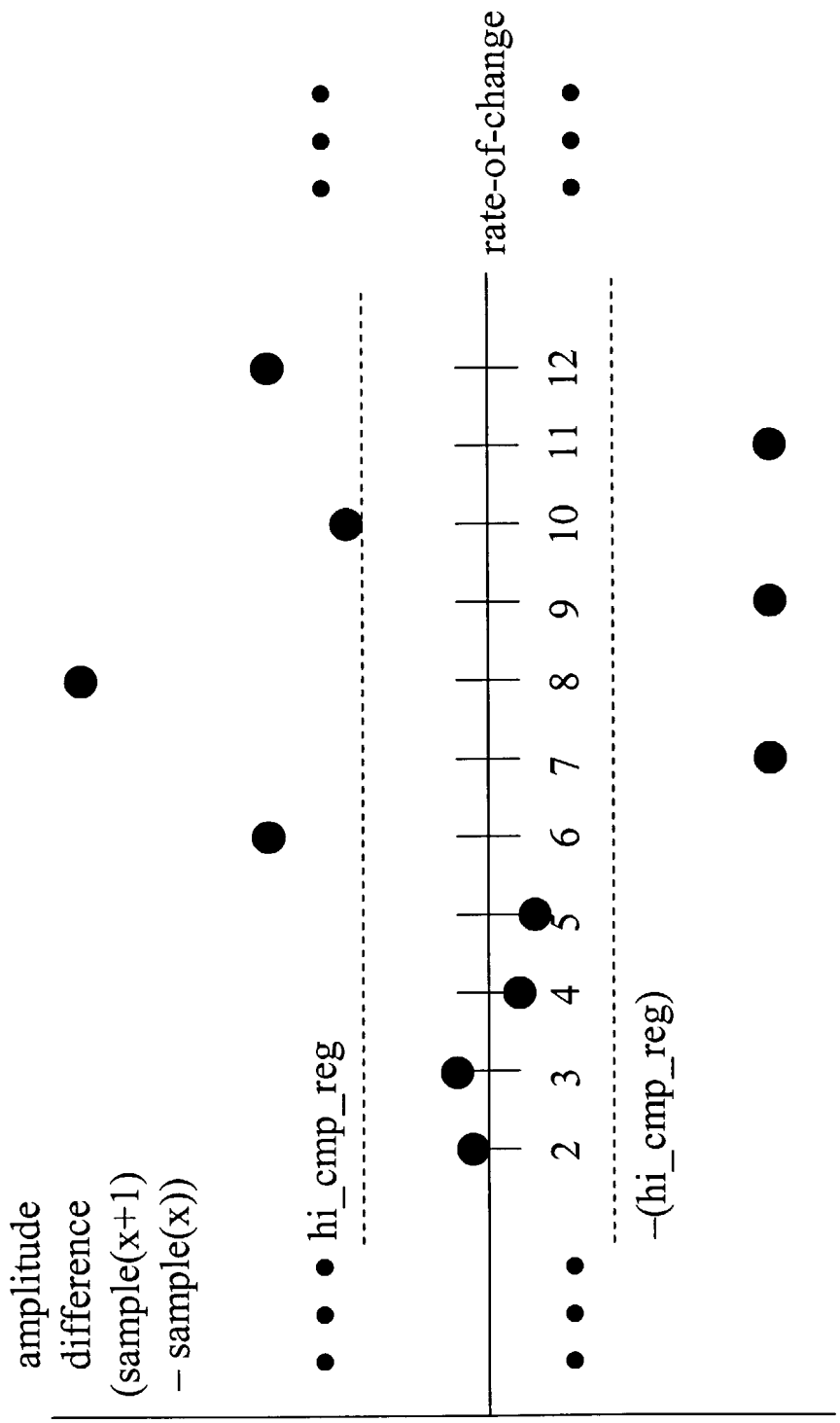
FIG. 9 shows an application of a magnitude threshold to the series of FIG. 6.

FIG. 9 shows an application of ROC evaluator 332 to the sequence of ROCs shown in FIG. 6. In this example, ROC evaluator 332 outputs one binary result (e.g. '0' or 'low') in response to ROCs 2–5, whose magnitudes are less than the threshold value, and the other binary result (e.g. '1' or 'high') in response to ROCs 6–12, whose magnitudes are greater than the threshold value. ROCs whose magnitudes are equal to the threshold value may be handled according to a design choice.

Other implementations of ROC evaluator 330 may compare magnitudes using other circuit configurations and/or sequences of instructions. The implementation selected for a particular application may depend on factors such as the numeric format of the rate of change outputted by ROC calculator 310 (e.g. sign/magnitude, one's complement, two's complement, etc.). For example, if the ROC is presented in sign/magnitude form, it may be desirable to implement ROC evaluator 330 as a single comparison between the magnitude portion of the ROC and the magnitude portion of a predetermined threshold.

It may be desirable in some applications to use different upper and lower ROC value thresholds instead of a single ROC magnitude threshold. Likewise, it may be desirable for such threshold or thresholds to be programmable or otherwise capable of being changed (possibly even during operation). For example, in an application of an implementation of filter 100 to video signal processing, it may be desirable to change a threshold value depending on the particular source of the video signal being processed.

Figure 10:
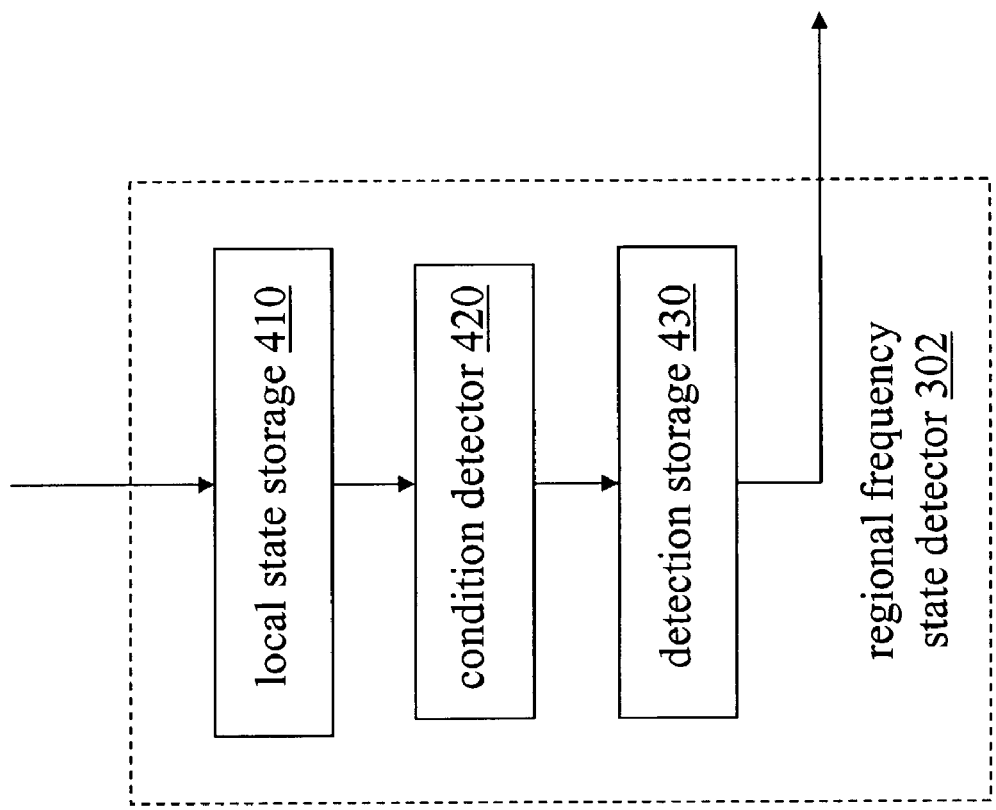
FIG. 10 shows a block diagram of an implementation 302 of regional frequency state detector 300.

FIG. 10 shows a block diagram of one implementation 302 of RFSD 300. Local state storage 410 records the local frequency state indications outputted by LFSD 200. Condition detector 420 detects whether a predetermined condition exists among the recorded indications. Detection storage 430 records information relating to a location of the detected condition within the sequence.

Figure 11:
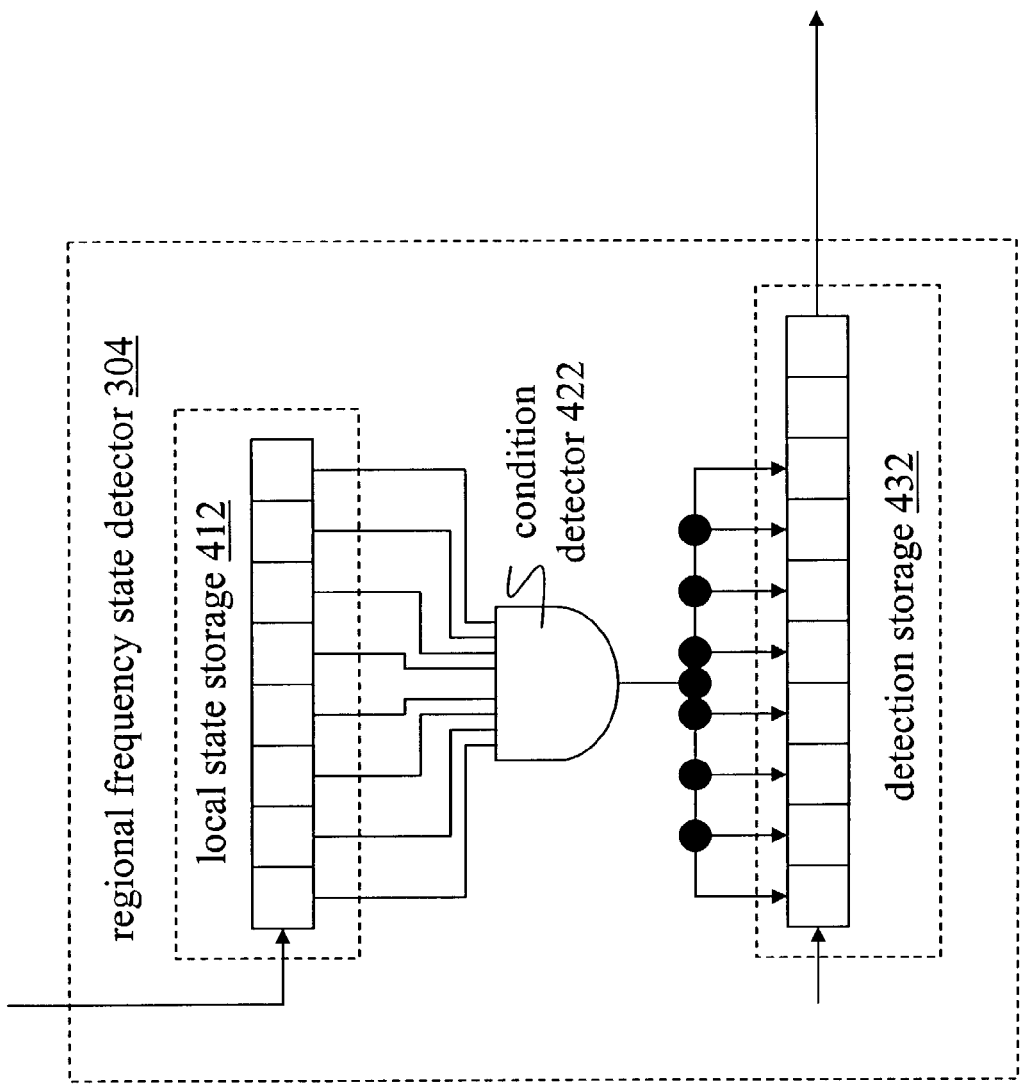
FIG. 11 shows a block diagram of an implementation 304 of regional frequency state detector 302.

FIG. 11 shows a block diagram of one implementation 304 of RFSD 302. RFSD 304 includes an implementation 412 of local state log 410 as a shift register that stores indications received from LFSD 200. Condition detector 420 is implemented as a eight-input AND gate 422. In this example, condition detector 422 indicates whether the particular local frequency state has been detected (e.g. whether the magnitude of the ROC has exceeded the magnitude of the ROC threshold) for eight consecutive evaluations.

Condition detector 420 may be implemented in several different forms. For example, condition detector 420 may be implemented to detect regions in which fewer than eight (e.g. four or six) consecutive indications indicate a particular frequency state, or only regions in which more than eight consecutive indications indicate the particular frequency state. Condition detector 420 may also be implemented to detect regions in which a particular proportion of indications (e.g. six out of eight consecutive indications, or eight out of ten) indicate the particular frequency state. Condition detector 420 may also be implemented such that the detected characteristics may be changed (e.g. from a region of six consecutive indications to a region of eight consecutive indications) during operation of filter 100 (e.g. in real-time).

A form of condition detector 420 may be selected based upon an intended application. One operation to which an implementation of filter 100 may be applied is compensation for attenuation of high frequencies in a digital video signal (e.g. as may arise during transmission of the signal in analog form). In at least some display situations (e.g. on a desktop digital display such as a liquid-crystal panel), such attenuation may not be visible if the extent of the high-frequency region is less than about six or eight pixels. On the other hand, such attenuation may become quite visible if the extent of the high-frequency region is more than eight pixels. Therefore, it may be desirable for such an implementation of filter 100 to include an implementation of condition detector 420 that is configured to detect regions in which a local high-frequency state has been indicated over at least six or eight evaluations.

Figure 12:
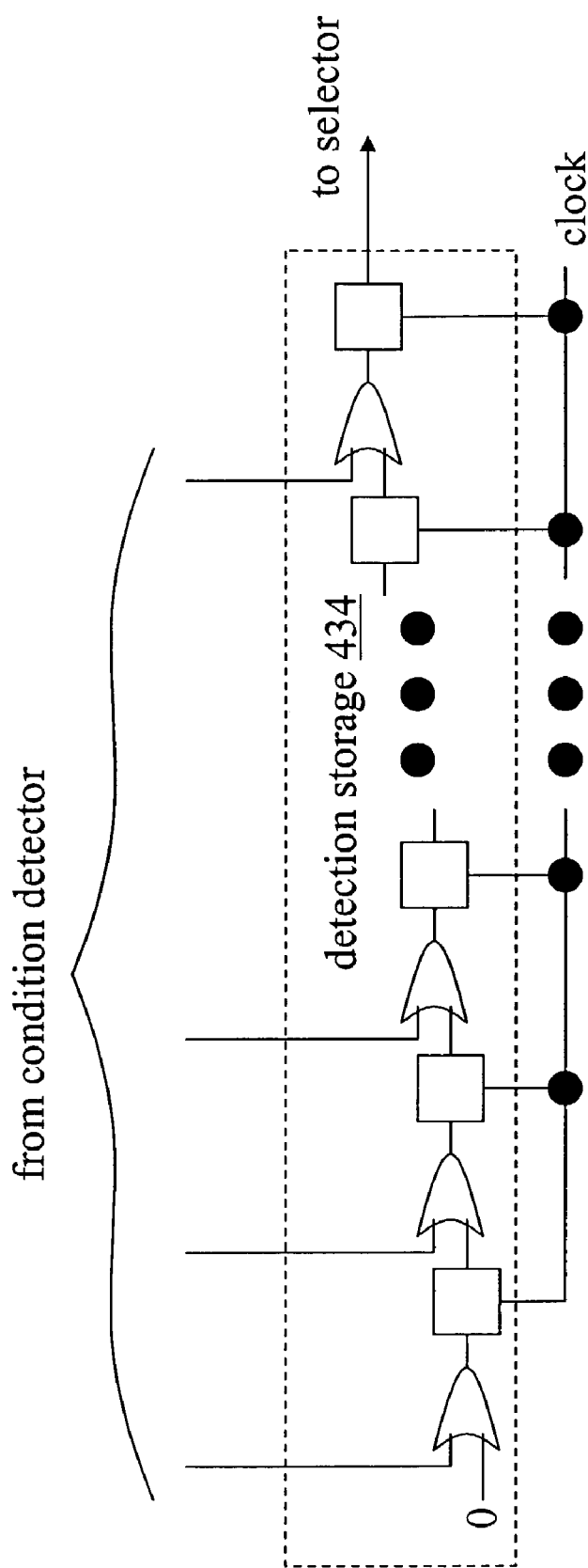
FIG. 12 shows a block diagram of an implementation 434 of detection storage 432.

Detection storage 432 records the results outputted by condition detector 422. FIG. 12 shows one implementation 434 of detection storage 432 as a shift register which has been modified to allow updating of stored values. FIG. 12 illustrates detection storage 434 as a sequence of OR gates and storage elements, although other equivalent implementations may also be used. In some applications, it may be easier and/or otherwise desirable to implement detection storage 432 such that the high or '1' state indicates the default and the low or '0' state (e.g. a reset) indicates detection.

Figure 13:
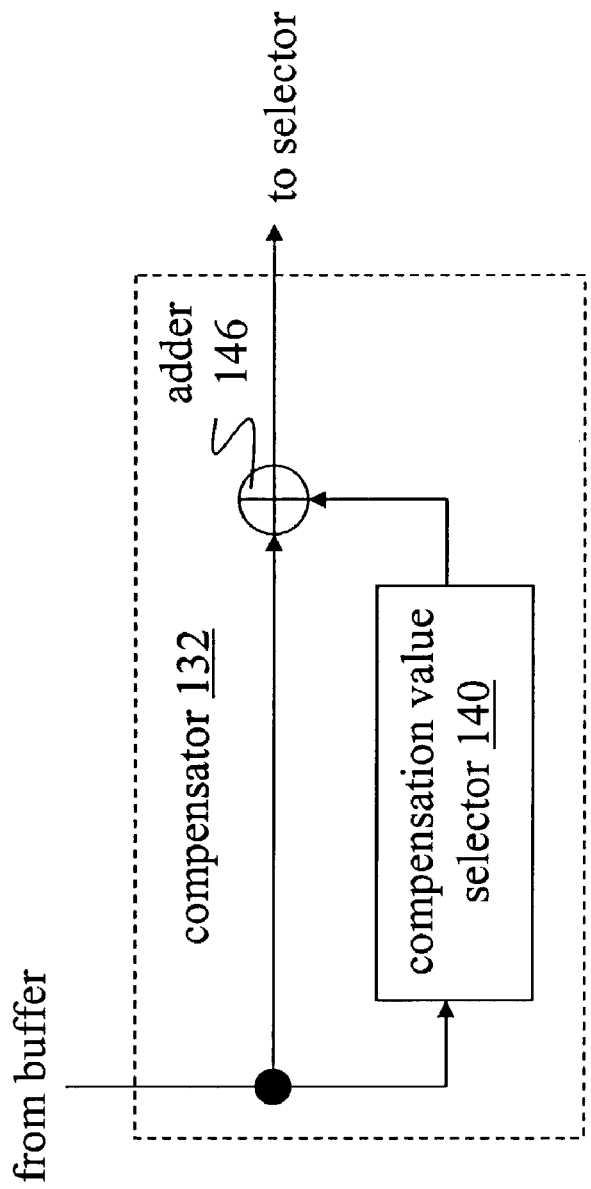
FIG. 13 shows a block diagram of an implementation 132 of compensator 130.

As shown in FIG. 1, selector 150 receives data values from buffer 110 and compensator 130. FIG. 13 shows one implementation 132 of compensator 130, which compensates a value received from buffer 110 by adding a compensation value outputted by compensation value selector 140.

Figure 14:
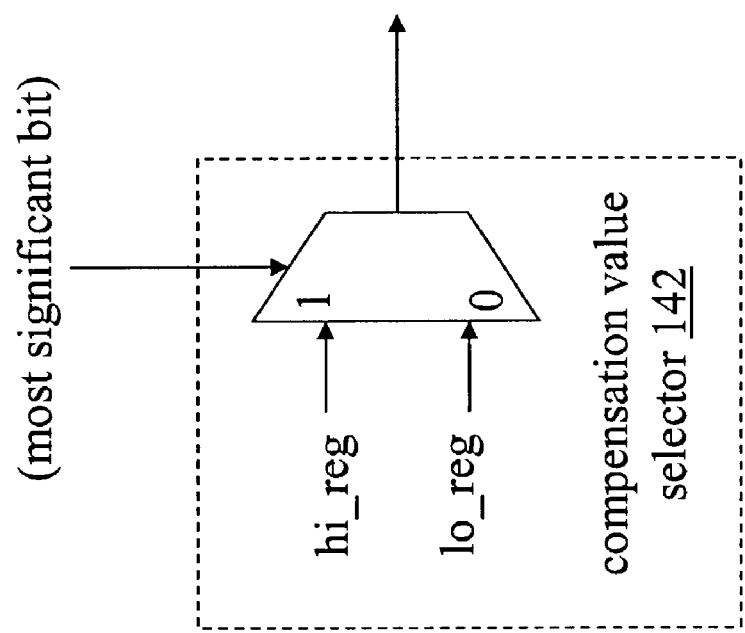
FIG. 14 shows a block diagram of an implementation 142 of compensation value selector 140.

FIG. 14 shows one implementation 142 of compensation value selector 140, which selects between the predetermined compensation values hi_reg and lo_reg depending upon the value received from buffer 110. In this particular implementation, compensation value selector 142 performs the selection according to the most significant bit of the value received from buffer 110.

It may be desirable for the result outputted by compensator 130 to be restricted within predetermined minimum and maximum bounds. For 8-bit data values, for example, it may be desirable to prevent compensator 130 from decreasing a data value below 0 or increasing a data value above 255. In such a case, adder 146 of compensator 132 may be implemented to be a saturating adder.

Figure 15:
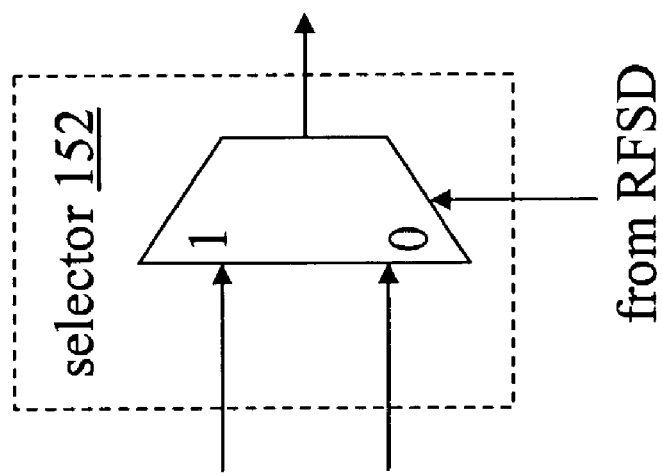
FIG. 15 shows a block diagram of an implementation 152 of selector 150.

As shown in FIG. 1, selector 150 selects between data values based on a select signal from RFSD 300. FIG. 15 shows a block diagram of an implementation 152 of selector 150 as a two-to-one multiplexer.

Figure 16:
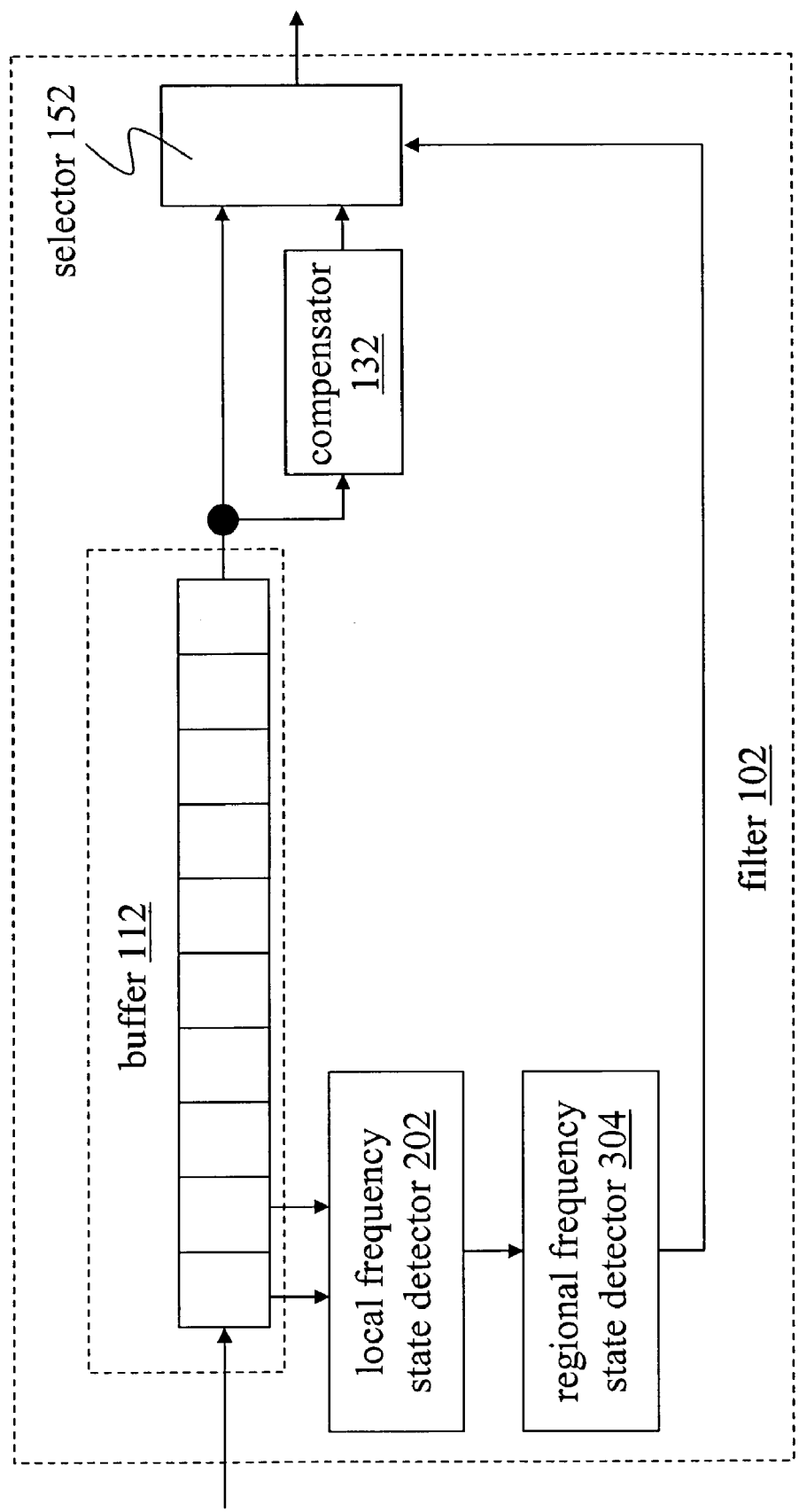
FIG. 16 shows a block diagram of an implementation 102 of filter 100.

FIG. 16 shows an implementation 102 of filter 100. In this implementation, selector 152 receives a value of the sequence from buffer 112, and a corresponding compensated value from compensator 132. Selector 152 passes the appropriate value based on a select signal from RFSD 304. In this implementation, the select signal indicates whether the region of the sequence within which the value is located was found to be a high-frequency region. If the select signal indicates that the value is within such a region, then the compensated value is passed. Otherwise, the value from buffer 112 is passed.

Figure 17:
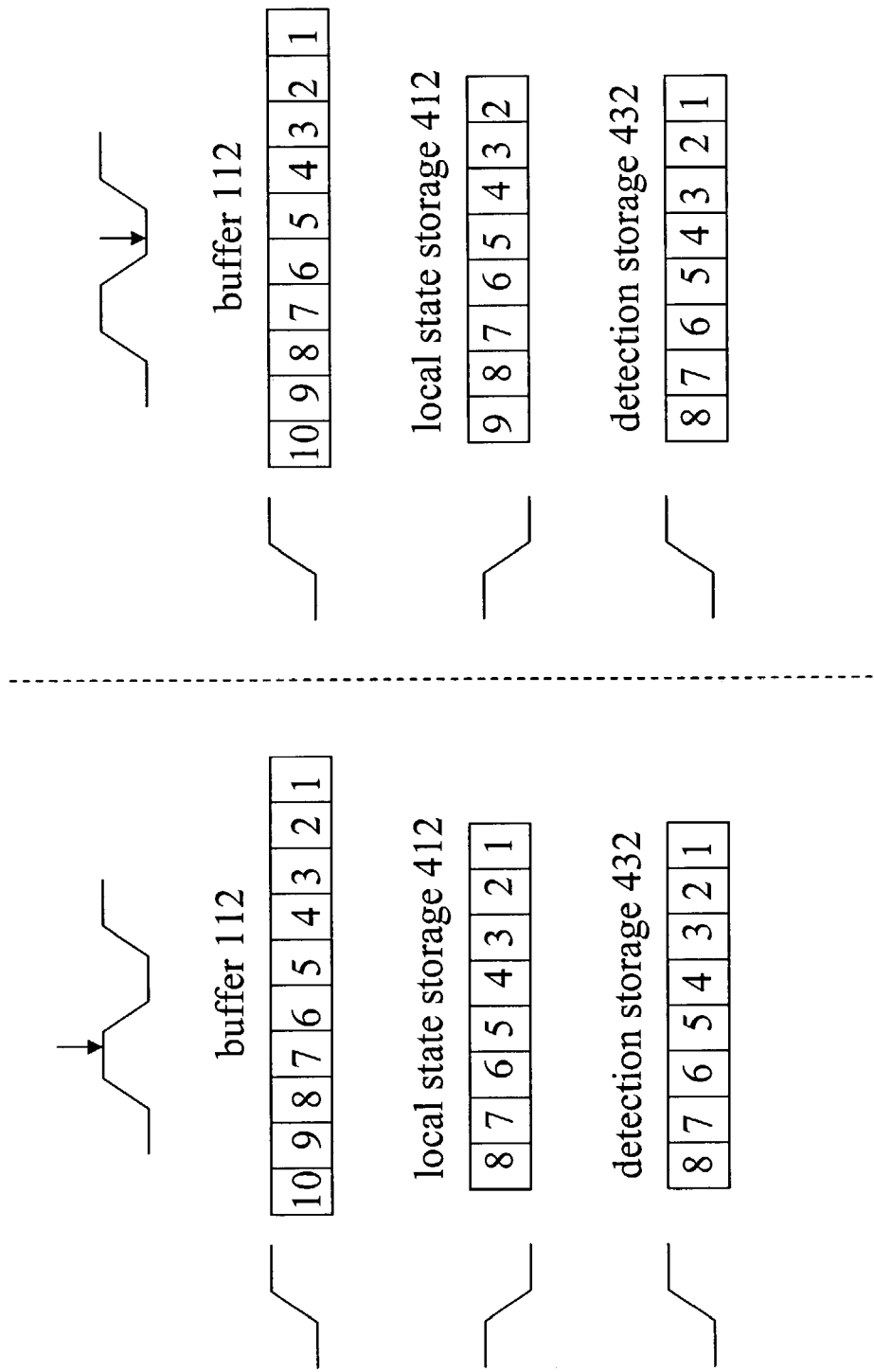
FIG. 17 shows timing diagrams for an application of filter 102.

It may be desirable for buffer 110 to contain more storage states than detection storage 430. To illustrate one reason to implement such a condition, FIG. 17 shows an exemplary comparison of states of buffer 112, local state storage 412, and detection storage 432 as discussed above at two consecutive moments of time. In this example, it is assumed that all three storage units operate according to the same clock signal, that buffer 412 and detection storage 432 latch their inputs upon the rising edge of this clock signal, and that local state storage 412 latches its input upon the falling edge of the clock signal.

The left panel of FIG. 17 shows a state at one moment of time (i.e. after latching and settling of buffer 112 and detection storage 432), and the right panel shows a state at a moment of time that is about one-half clock cycle later (i.e. after latching and settling of local state storage 412). It may be observed that the most recently stored value in buffer 412 has not yet contributed to the values stored in the other storage units. However, this delay is compensated by the additional length of buffer 112 as compared to detection storage 432, such that the right-side outputs of these two storage units relate to the same value of the sequence. Therefore, RFSD 304 may deliver a select signal to selector 152 that corresponds to the data value received by selector 152 from buffer 112.

Figure 18:
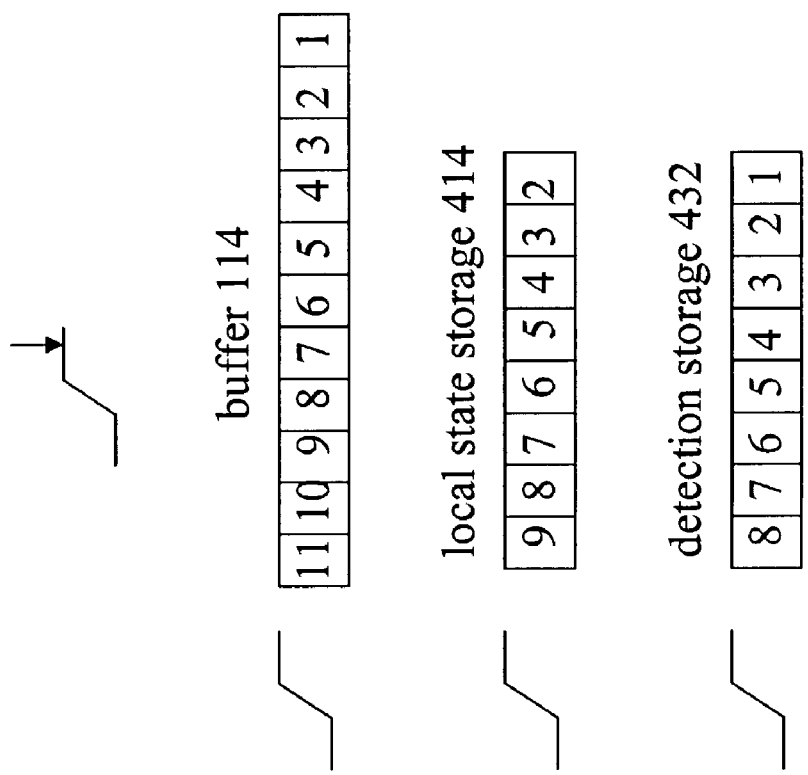
FIG. 18 shows timing diagrams for an application of an alternate embodiment of filter 100.

FIG. 18 shows a comparison of states of detection storage 432 and of alternate implementations 114 of buffer 110 and 414 of local state storage 410. In this example, local state storage 414 also latches on the rising clock edge, buffer 114 stores an additional value, and the right-side output of buffer 414 again corresponds to that of detection storage 432.

Figure 19:
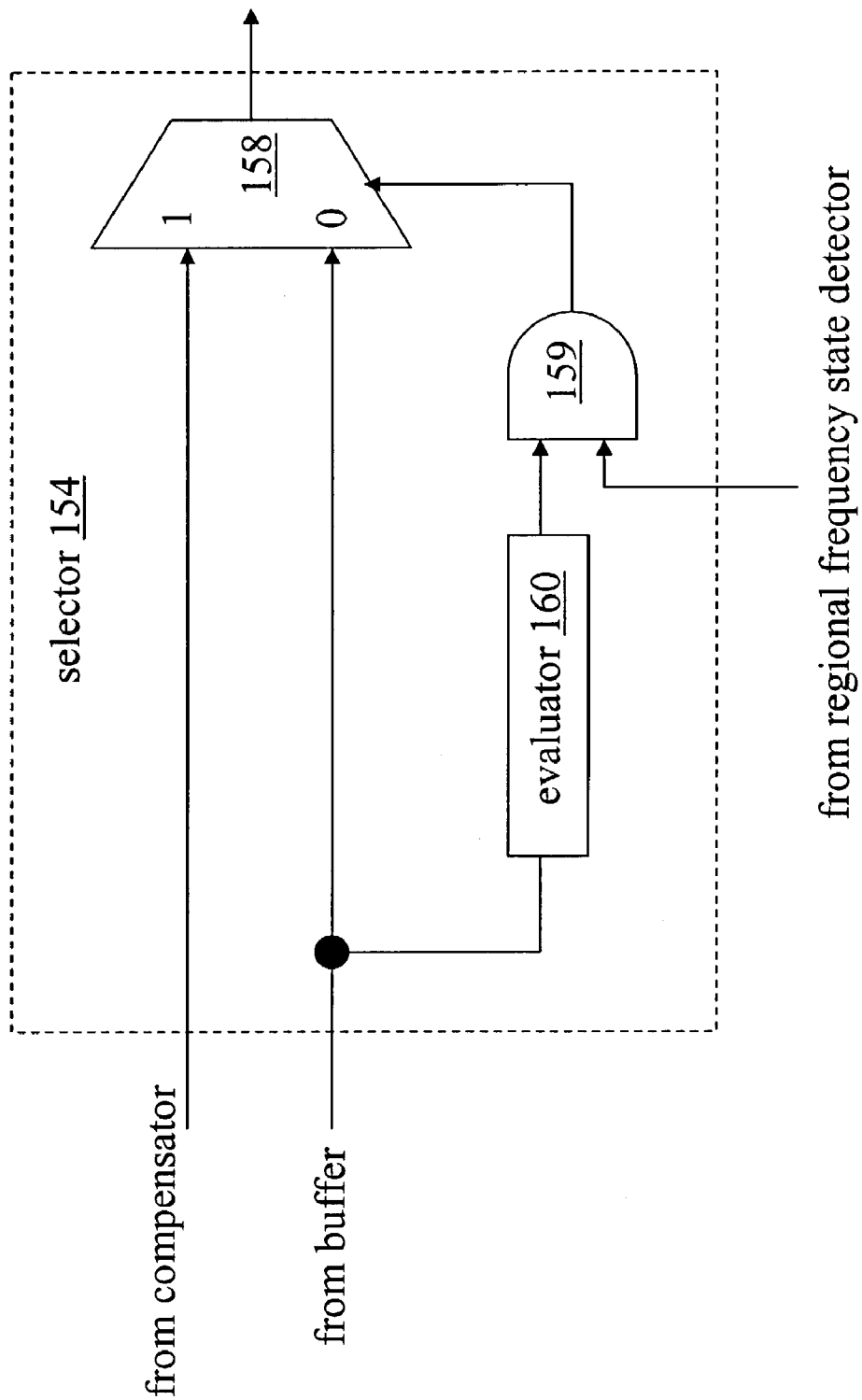
FIG. 19 shows a block diagram of an implementation 154 of selector 150.

It may be desirable for selector 150 to output a compensated value only if one or more additional conditions are met. FIG. 19 shows a block diagram of an implementation 154 of selector 150 that includes an evaluator 160. Evaluator 160 evaluates the value received from buffer 110 according to one or more predetermined criteria, and the selection made by selector 154 is a function of that evaluation. In this example, selector 154 outputs a compensated value only if the RFSD and evaluator 160 both indicate that the respective predetermined conditions have been detected.

Figure 20:
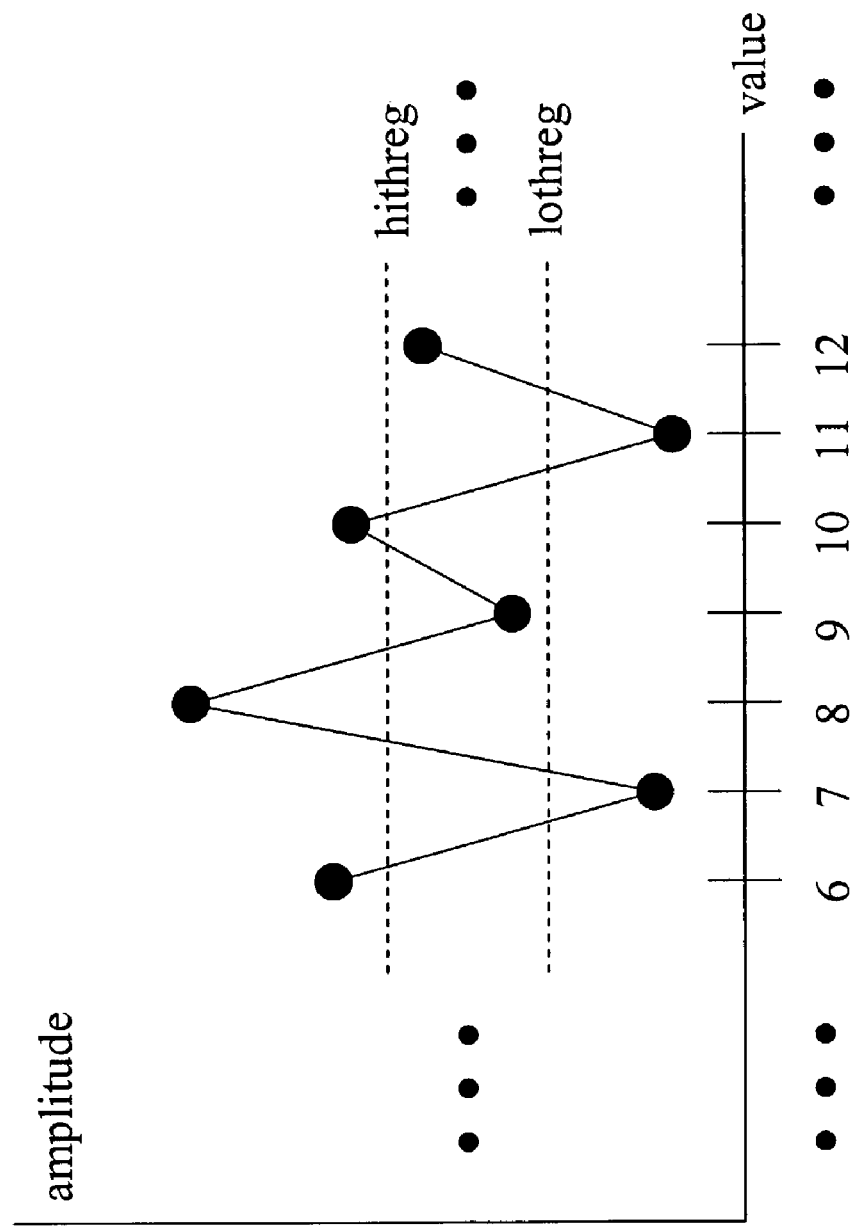
FIG. 20 shows a part of the portion shown in FIG. 5.

In order to illustrate an example of an application of such additional conditions, FIG. 20 shows a part of the portion shown in FIG. 5 that is assumed to have been identified as a high-frequency region. In this example, it is desired to output compensated values only if the values of the sequence lie within a band defined by the values hithreg and lothreg, and it is decided that the output of filter 100 will not be compensated for values lying outside that band.

Figure 21:
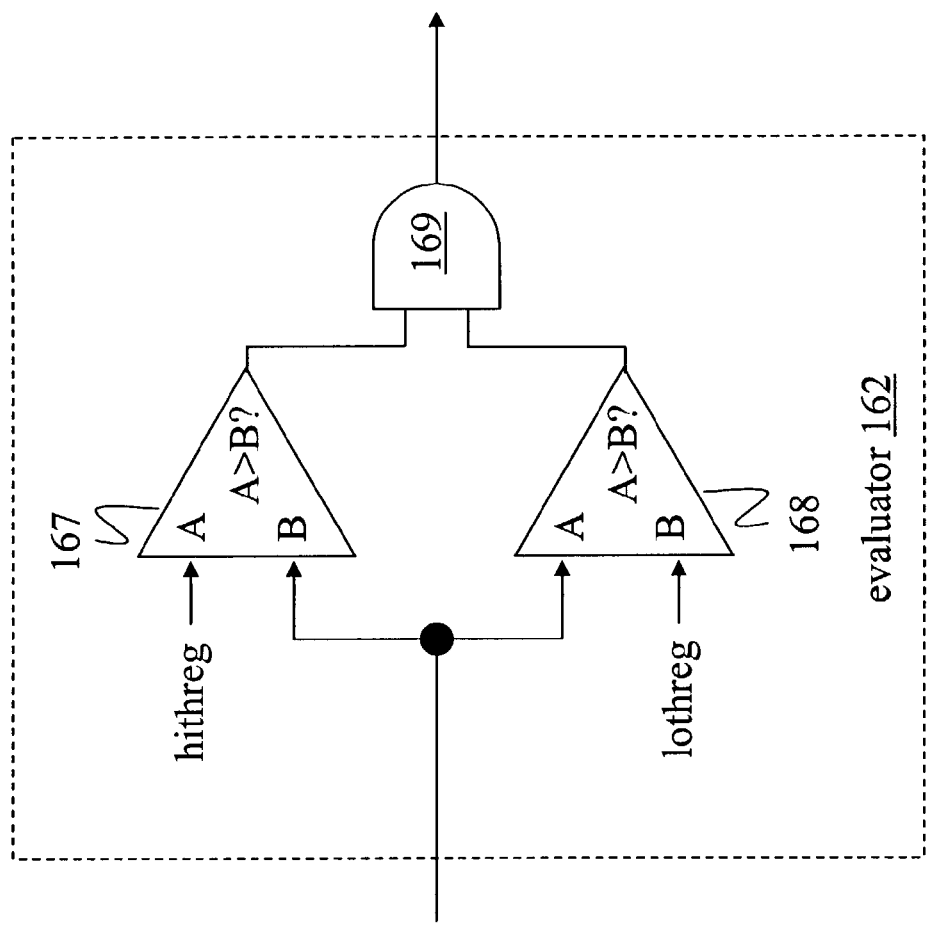
FIG. 21 shows a block diagram of an implementation 162 of evaluator 160.

FIG. 21 shows a block diagram of an implementation 162 of evaluator 160 that may be applied to such a situation. Comparator 167 indicates whether the value received from the buffer is less than a threshold hithreg, and comparator 168 indicates whether the received value is greater than a threshold lothreg. If both criteria are satisfied (i.e. the received value lies between hithreg and lothreg), then evaluator 162 indicates that the condition has been detected.

Figure 22:
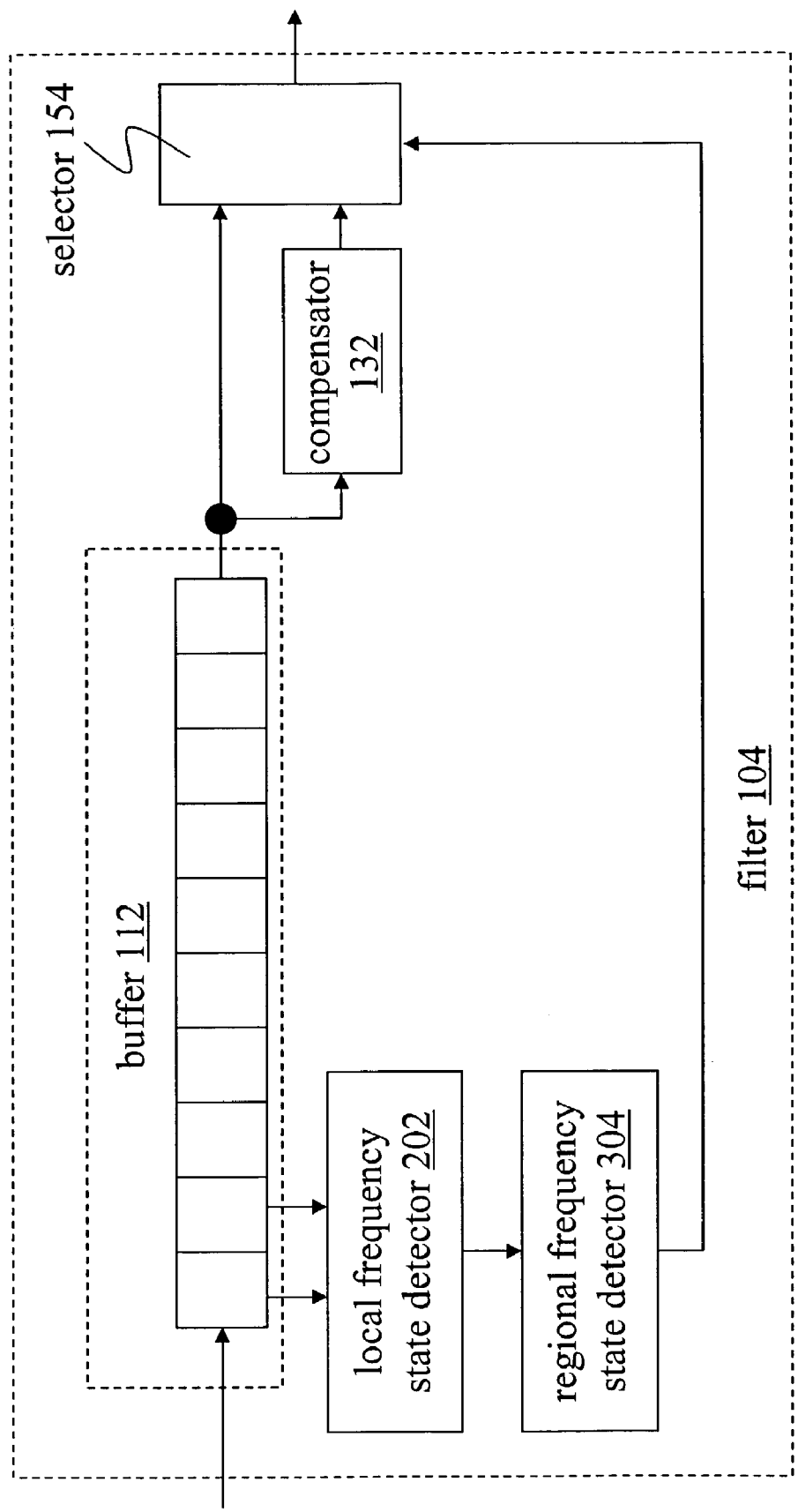
FIG. 22 shows a block diagram of an implementation 104 of filter 100.
Figure 23:
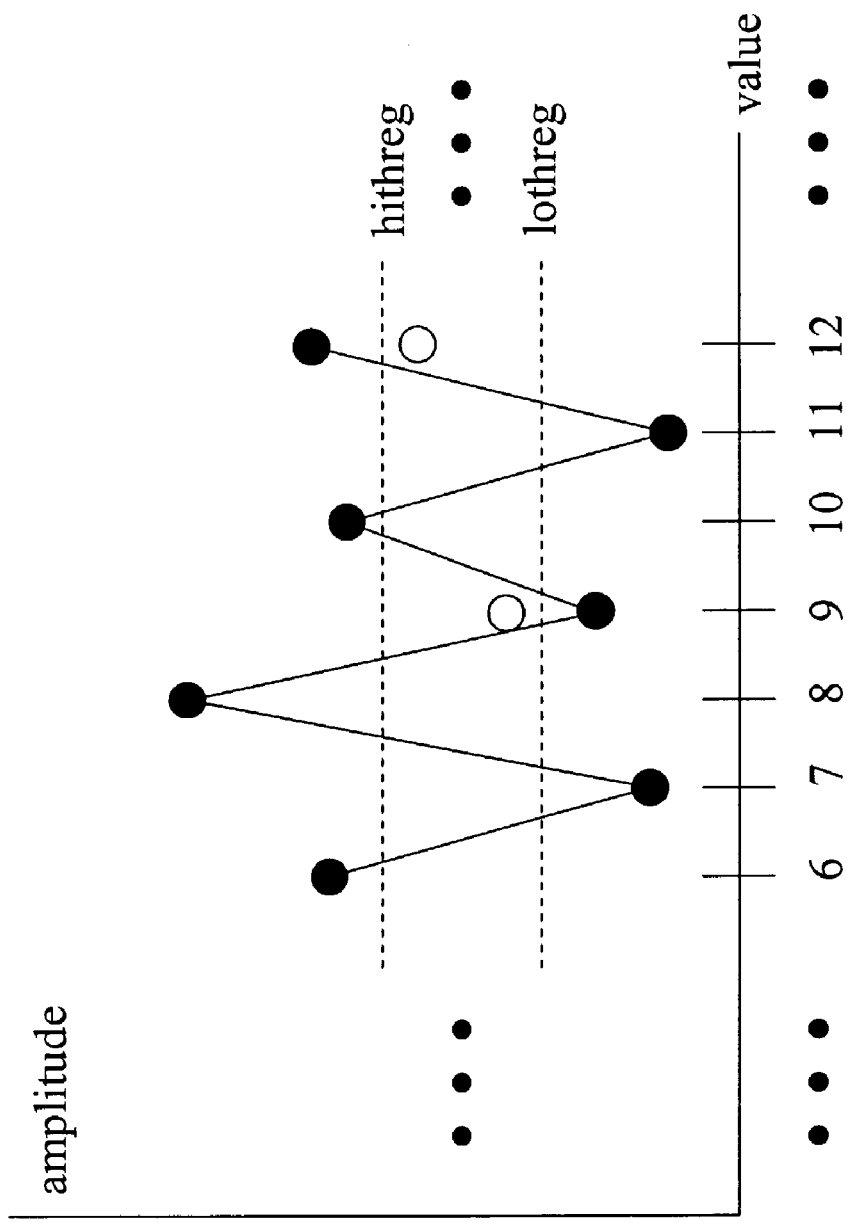
FIG. 23 shows an output of filter 104 in response to the part shown in FIG. 20.

FIG. 22 shows a block diagram of an implementation 104 of filter 100 including selector 154. FIG. 23 shows an example of an output of filter 104 as applied to the signal portion shown in FIG. 20. In this example, the open circles indicate values that have been compensated.

Figure 24:
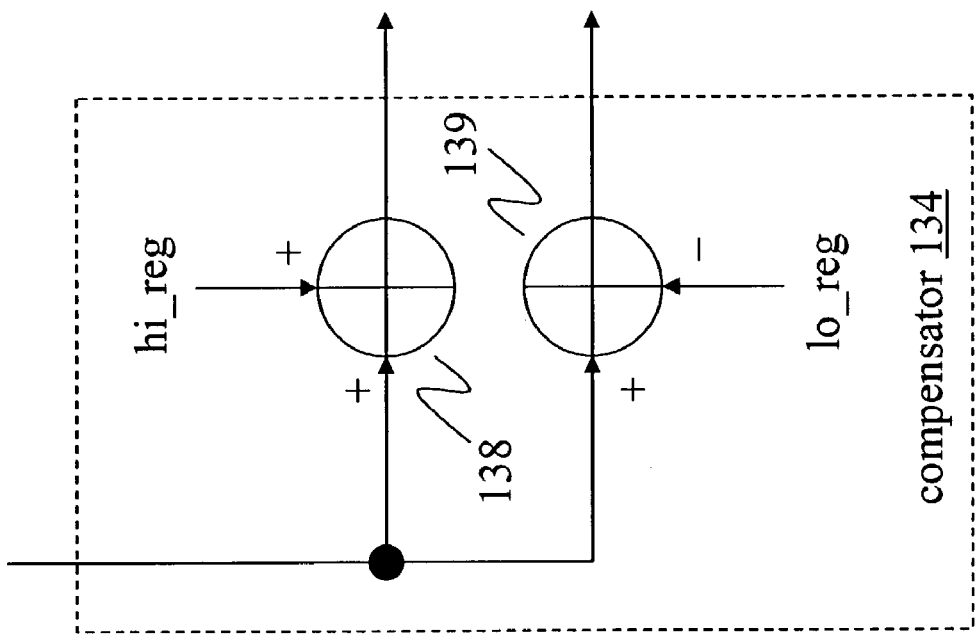
FIG. 24 shows a block diagram of an implementation 134 of compensator 130.

Operations of selection and compensation as described with respect to implementations of selector 150 and compensator 130 may be performed using several different structures. For example, FIG. 24 shows a block diagram of an implementation 134 of compensator 130 that outputs two compensated values. Specifically, adder 138 increases the received value by the value hi_reg discussed above, and adder 139 decreases the received value by the value lo_reg discussed above.

Figure 25:
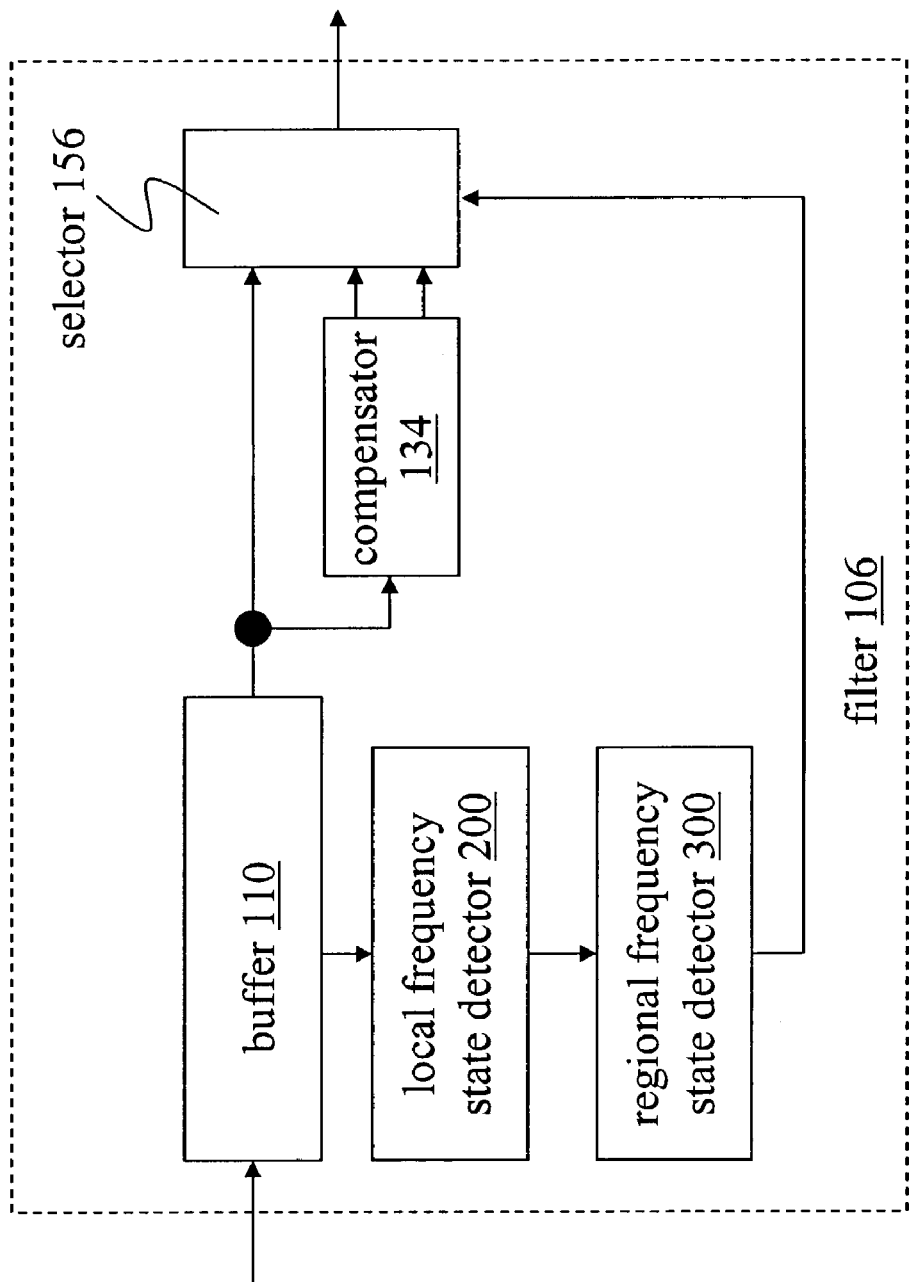
FIG. 25 shows a block diagram of an implementation 106 of filter 100.
Figure 26:
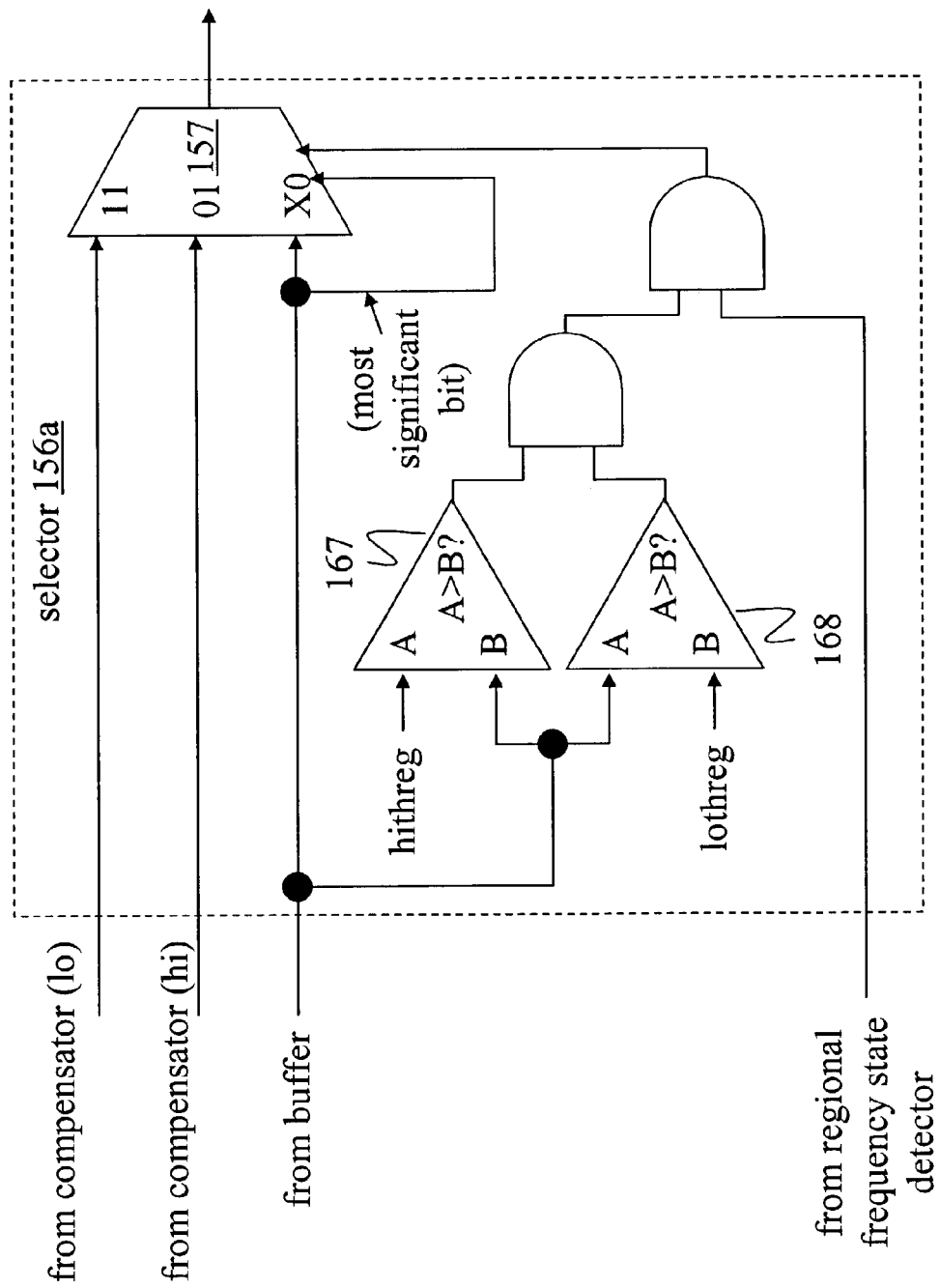
FIG. 26 shows a block diagram of an implementation 156a of selector 156.

FIG. 25 shows an implementation 106 of filter 100 that includes compensator 134 and an implementation 156 of selector 150 that selects the appropriate output of compensator 134 if compensation is indicated. FIG. 26 shows a block diagram of one implementation 156a of selector 156; other equivalent mechanisms may be used to perform the selections described above.

Figure 27:
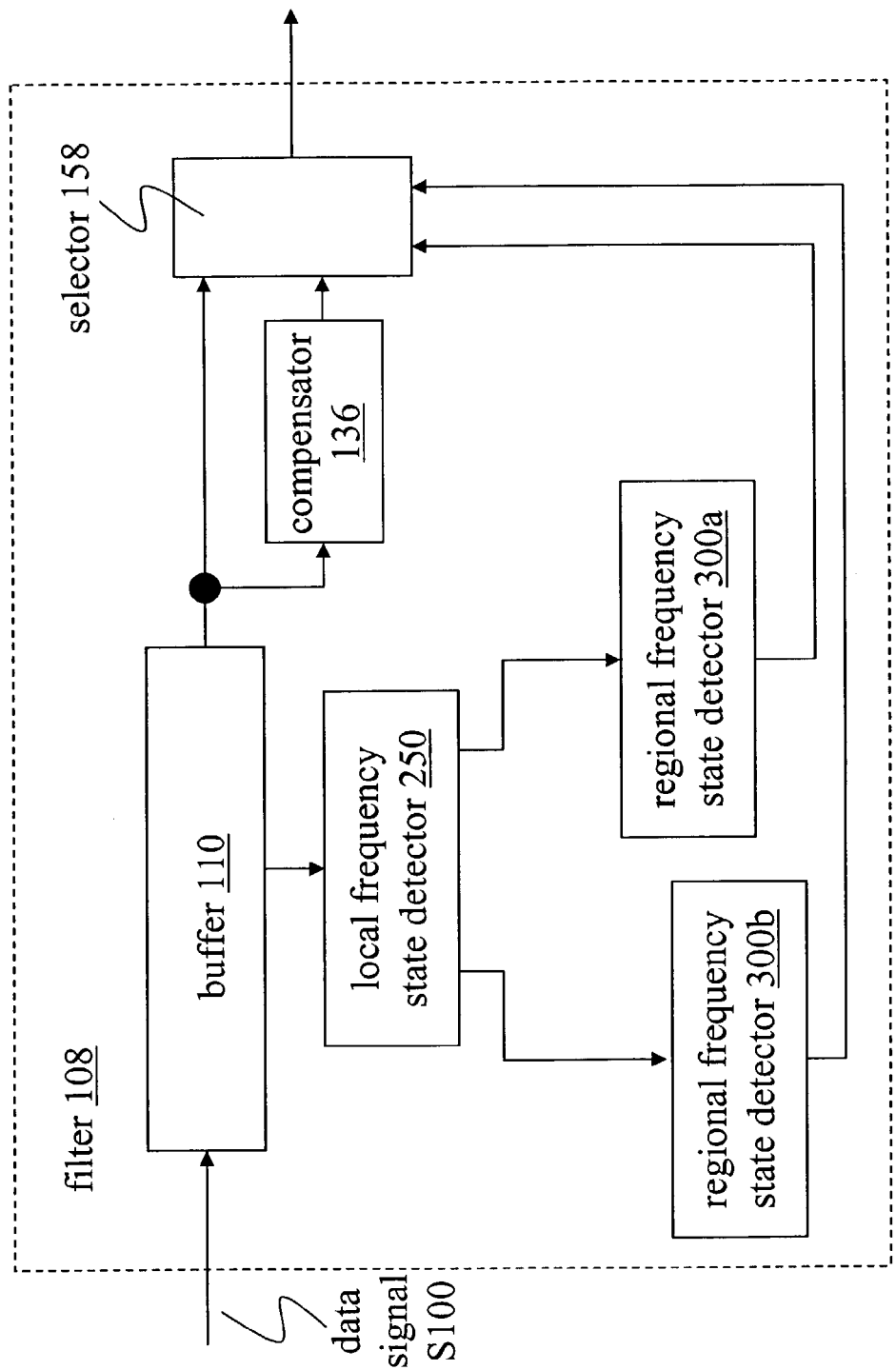
FIG. 27 shows a block diagram of an implementation 108 of filter 100.

It may be desirable for an implementation of filter 100 to perform detection of more than one type of regional frequency state. For example, it may be desired to perform processing operations on high-frequency regions of a signal and also on low-frequency regions of a signal. FIG. 27 shows a block diagram of an implementation 108 of filter 100 that includes two RFSDs 300a and 300b and an implementation 250 of LFSD 200 that outputs separate local frequency state indications to each RFSD. If desired, the RFSDs may be implemented to detect different conditions (e.g. one RFSD may detect that the corresponding local frequency state indication has occurred over six evaluations, while the other RFSD may detect that the corresponding local frequency state indication has occurred over eight evaluations).

Figure 28:
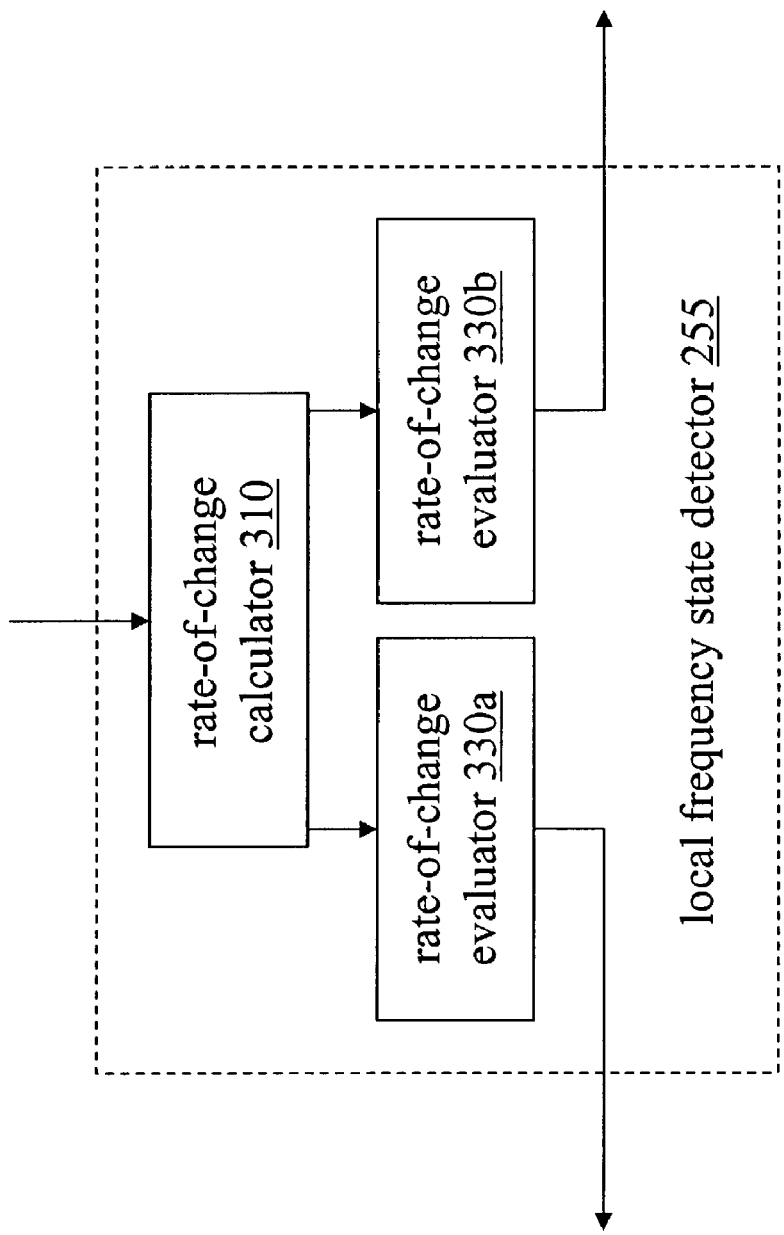
FIG. 28 shows a block diagram of an implementation 255 of local frequency state detector 250.

FIG. 28 shows a block diagram of an implementation 255 of LFSD 250 that includes ROC calculator 310 and two ROC evaluators 330a and 330b. In one example of separate detection of high and low local frequency states, one of the ROC evaluators (i.e. the high-frequency evaluator) is implemented as ROC evaluator 332 of FIG. 8, while the other (i.e. the low-frequency evaluator) is implemented to perform a converse set of comparisons with respect to a low magnitude threshold lo_comp_reg.

Figure 29:
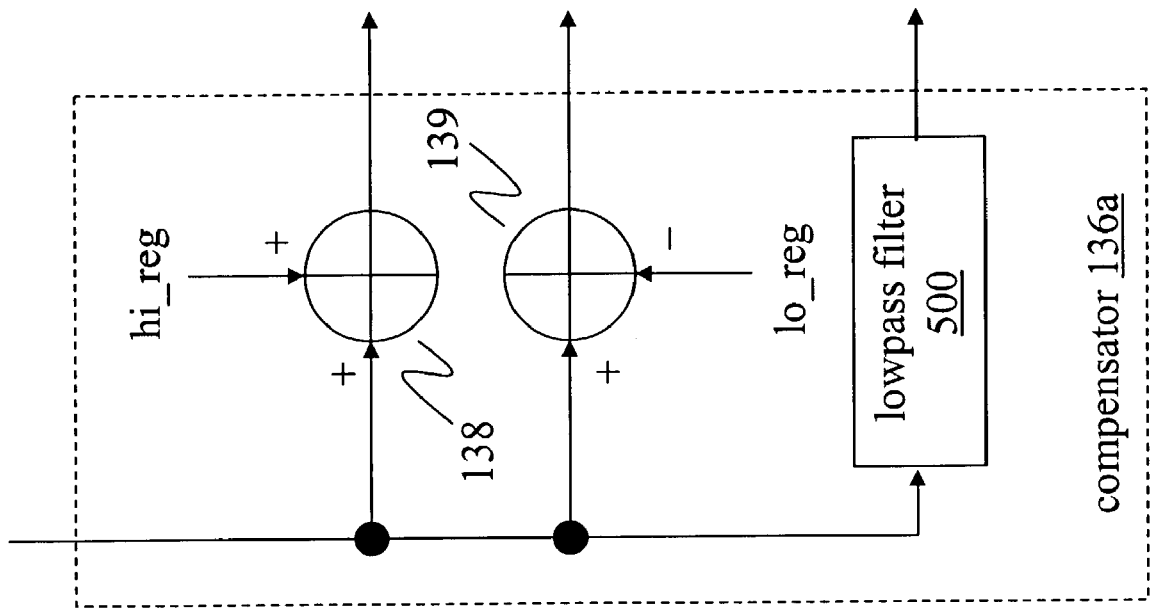
FIG. 29 shows a block diagram of an implementation 136a of compensator 136.

FIG. 29 shows a block diagram of an implementation 136a of compensator 130 that includes a lowpass filter 500. Such a filter may be applied to remove impulsive and/or other noise from low-frequency regions. For example, noise may be particularly noticeable within portions of a video signal that otherwise have little frequency content.

Figure 30:
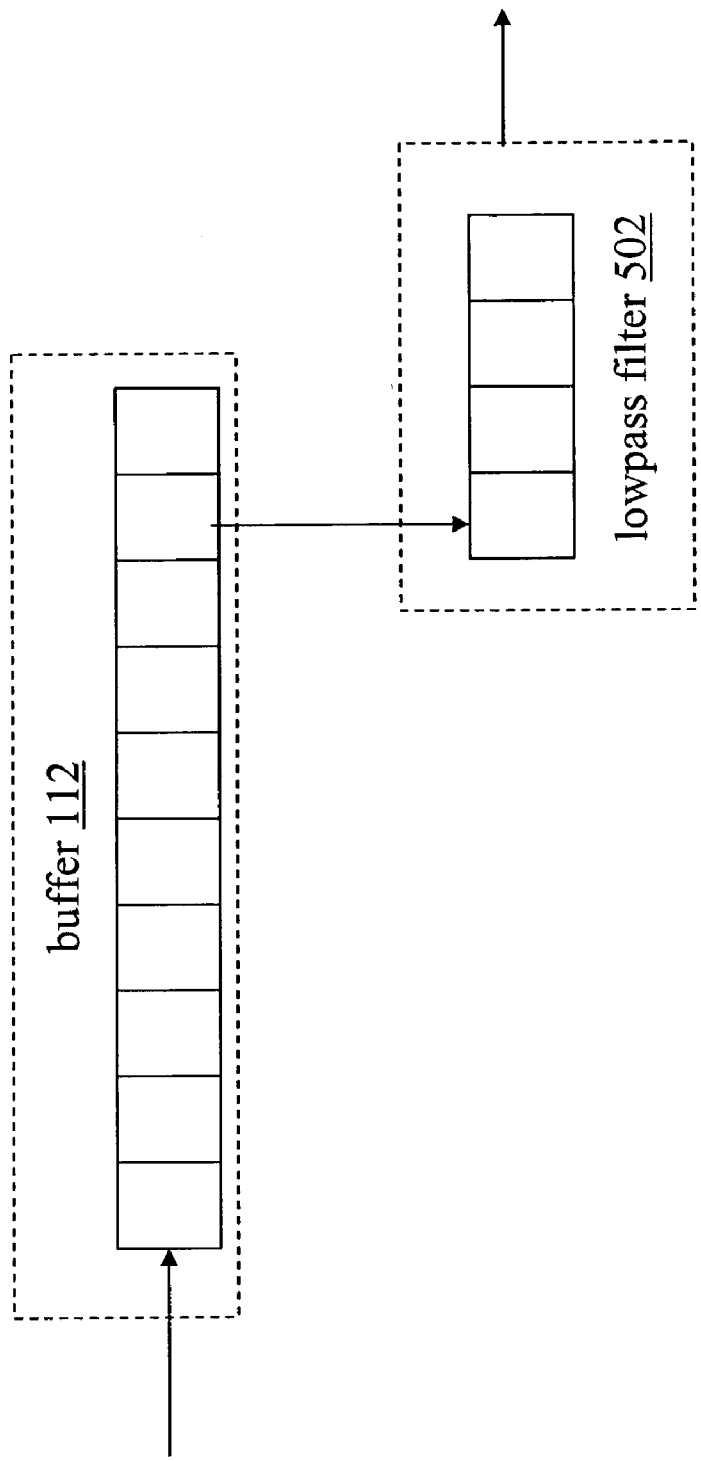
FIG. 30 shows an application of an implementation 502 of lowpass filter 500.

FIG. 30 shows an application of an implementation 502 of lowpass filter 500 that includes storage elements. In this example, filter 502 includes a shift register that may be updated with values from buffer 112 that are not yet being outputted and/or may produce outputs that are functions of past data values. Such an implementation may be used to apply feedback and/or feedforward filter algorithms.

Lowpass filter 500 may be implemented as a finite impulse response filter. For example, lowpass filter 500 may be implemented to output a value that is the dot product of a coefficient vector and a string of values from buffer 112. Examples of suitable four-value coefficient vectors include (0.25, 0.25, 0.25, 0.25) and (1/8, 3/8, 3/8, 1/8). An embodiment of filter 100 that includes a lowpass filter may also include a storage unit to store one or more coefficient vectors, which may be selected and/or reprogrammed.

Figure 31:
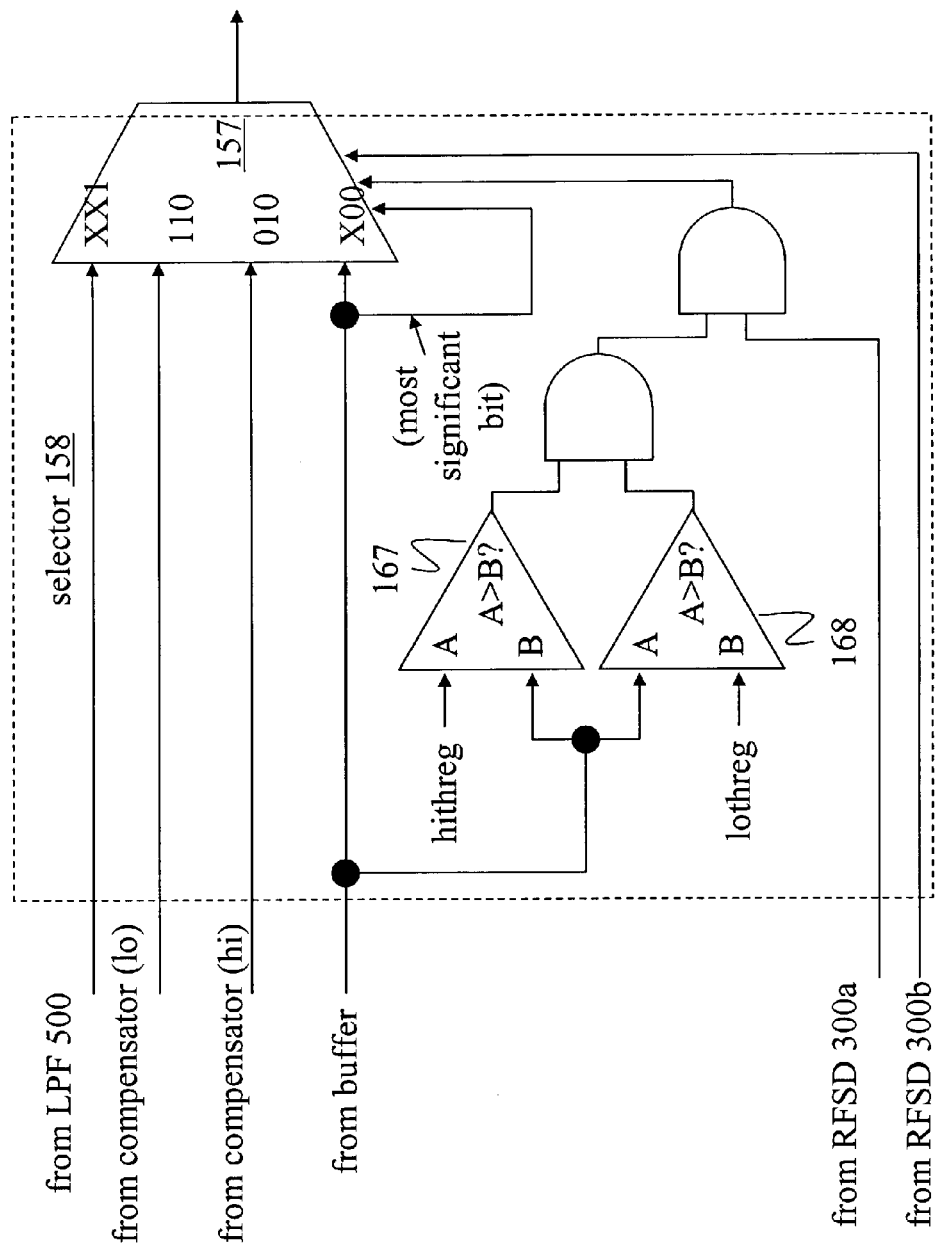
FIG. 31 shows a block diagram of an implementation of selector 158.

FIG. 31 shows one implementation of selector 158. Many other arrangements may be used to perform appropriate selection among the inputs values according to the select signals from the RFSDs (and the value received from buffer 110, if desired).

The foregoing presentation of the described embodiments is provided to enable any person skilled in the art to make or use the present invention. Various modifications to these embodiments are possible, and the generic principles presented herein may be applied to other embodiments as well.

Filter 100 may be implemented on a single chip or in a chipset. Alternatively, different portions of filter 100 may be implemented in different modules and/or may execute on different processors. Operational blocks of filter 100 may be implemented as logic gates and/or as sets of instructions executed by one or more processors. Software or firmware implementations of such blocks may include one or more of a set of SIMD (single-instruction, multiple-data) instructions (e.g. the MMX, SSE, or SSE2 extension sets of Intel Corp., Santa Clara, Calif.; the 3DNow! Extension set of AMD Corp., Sunnyvale, Calif.; the AltiVec extension set of Motorola, Schaumberg, Ill.).

Filter 100 may also include communications capabilities, such as a readback register, through which values of parameters and/or data may be downloaded for purposes of testing or evaluation.

For example, the invention may be implemented in part or in whole as a hard-wired circuit, as a circuit configuration fabricated into an application-specific integrated circuit, or as a firmware program loaded into non-volatile storage or a software program loaded from or into a data storage medium as machine-readable code, such code being instructions executable by an array of logic elements such as a microprocessor or other digital signal processing unit. Thus, the present invention is not intended to be limited to the embodiments shown above but rather is to be accorded the widest scope consistent with the principles and novel features disclosed in any fashion herein.

What is claimed is:

1. A digital filter comprising:
   a local frequency state detector configured to indicate a predetermined local frequency state in a sequence of data values, the local frequency state detector including a rate-of-change calculator configured to calculate a change of value between values of the sequence and a rate-of-change evaluator configured to evaluate the change of value calculated by the rate-of-change calculator;
   a regional frequency state detector configured to detect a predetermined condition in a region of the sequence, based on a plurality of local frequency state indications determined by the rate-of-change evaluation, and to output a select signal based on the detection;
   a compensator configured to output a compensated value of a value of the sequence; and
   a selector configured to output one of the value and the compensated value, based on the select signal.

2. The digital filter according to claim 1, wherein the compensator includes a saturating adder.

3. The digital filter according to claim 1, wherein the rate-of-change calculator is configured to calculate a change of value between consecutive values of the sequence.

4. The digital filter according to claim 1, wherein the regional frequency state detector includes a condition detector configured to detect a high-frequency region of a predetermined length.

5. A method of signal processing, said method comprising:
- digitizing an analog signal having amplitude information;
- detecting in the digitized signal an amplitude transition having a magnitude at least equal to a predetermined threshold value using a rate-of-change calculator configured to calculate a change of value between values of a sequence;
- evaluating the change of value calculated by the rate-of-change calculator; and
- in response to the evaluating, increasing the magnitude of the amplitude transition with respect to other amplitude transitions in the digitized signal.

6. A method of signal processing, said method comprising:
- digitizing an analog signal having amplitude information;
- calculating a rate-of-change value between values of a sequence;
- evaluating the rate-of-change value calculated;
- storing a plurality of the rate-of-change evaluations;
- detecting a high-frequency region of the digitized signal based on the plurality of the rate-of-change evaluations; and
- in response to said detecting, increasing a high-frequency content of the digitized signal in at least a portion of the high-frequency region.

7. The method of signal processing according to claim 6, wherein said detecting a high-frequency region of the digitized signal includes detecting a predetermined plurality of local frequency states within the region.

8. The method of signal processing according to claim 6, wherein said increasing a high-frequency content of the digitized signal in at least a portion of the high-frequency region includes determining that a magnitude of a value of the digitized signal does not exceed a predetermined threshold.

9. A method of signal processing, said method comprising:
- detecting the presence of a first particular frequency state at a plurality of locations of a sequence of digital values using a rate-of-change calculator configured to calculate a change of value between values of the sequence;
- evaluating the change of value calculated by the rate-of-change calculator;
- based on the evaluation of the change of value, determining whether a condition exists with respect to a region of the sequence including the plurality of locations;
- producing a compensated value based on a value of the sequence; and
- according to said determining, selecting one among the compensated value and a value on which the compensated value is based.

* * * * *